(12) United States Patent
Li

(10) Patent No.: US 12,745,509 B2
(45) Date of Patent: Sep. 22, 2026

(54) LIGHT-EMITTING DEVICE AND METHOD FOR MANUFACTURING THE SAME, DISPLAY SUBSTRATE

(71) Applicants: BEIJING BOE TECHNOLOGY DEVELOPMENT CO., LTD., Beijing (CN); BOE TECHNOLOGY GROUP CO., LTD., Beijing (CN)

(72) Inventor: Dong Li, Beijing (CN)

(73) Assignees: BEIJING BOE TECHNOLOGY DEVELOPMENT CO., LTD., Beijing (CN); BOE TECHNOLOGY GROUP CO., LTD, Beijing (CN)

( * ) Notice: Subject to any disclaimer, the term of this patent is extended or adjusted under 35 U.S.C. 154(b) by 460 days.

(21) Appl. No.: 18/547,210

(22) PCT Filed: Oct. 28, 2022

(86) PCT No.: PCT/CN2022/128442

§ 371 (c)(1),
(2) Date: Aug. 21, 2023

(87) PCT Pub. No.: WO2024/087230

PCT Pub. Date: May 2, 2024

(65) Prior Publication Data

US 2025/0040339 A1 Jan. 30, 2025

(51) Int. Cl.
*H10K 50/16* (2023.01)
*H10K 71/16* (2023.01)

(52) U.S. Cl.
CPC ........... *H10K 50/166* (2023.02); *H10K 71/16* (2023.02)

(58) Field of Classification Search
CPC .... H10K 50/166; H10K 71/16; H10K 50/165; H10K 2101/40; H10K 50/16; H05B 33/10
See application file for complete search history.

(56) References Cited

U.S. PATENT DOCUMENTS 10,826,011 B1 11/2020 Angioni et al.
2019/0296257 A1 * 9/2019 Palles-Dimmock ... H10K 50/16
(Continued)

FOREIGN PATENT DOCUMENTS

CN 1822242 A 8/2006
CN 104167240 A 11/2014
(Continued)

*Primary Examiner* — Mohammad A Rahman
(74) *Attorney, Agent, or Firm* — Dority & Manning, P.A.

(57) ABSTRACT

A light-emitting device and a method for manufacturing the same, and a display substrate are provided. The light-emitting device includes a first electrode, an electron transport layer, a light-emitting layer, a hole transport layer and a second electrode that are arranged sequentially. The electron transport layer includes at least one electron transport sub-layer, and in the at least one electron transport sub-layer, an electron transport sub-layer closest to the light-emitting layer is an electron transport sub-layer with a C-axis orientation. The C-axis orientation is a direction perpendicular to a plane where the light-emitting layer is located. In the electron transport sub-layer with the C-axis orientation, in the direction perpendicular to the plane where the light-emitting layer is located, a ratio of a number of crystal grains having no overlap with adjacent crystal grains to a total number of crystal grains is greater than 85%.

20 Claims, 22 Drawing Sheets

(56) References Cited

U.S. PATENT DOCUMENTS

| | | | |
|---|---|---|---|
| 2021/0119161 | A1 | 4/2021 | Han et al. |
| 2021/0175258 | A1 | 6/2021 | Kim et al. |
| 2023/0217675 | A1 | 7/2023 | Takenaka |

FOREIGN PATENT DOCUMENTS

| | | | |
|---|---|---|---|
| CN | 109698282 | A | 4/2019 |
| CN | 113130789 | A | 7/2021 |
| CN | 113823568 | A | 12/2021 |
| CN | 114695815 | A | 7/2022 |
| KR | 20130053483 | A | 5/2013 |
| KR | 101734465 | B1 | 5/2017 |
| KR | 20180035278 | A | 4/2018 |
| KR | 102378322 | B1 | 3/2022 |

* cited by examiner

LIGHT-EMITTING DEVICE AND METHOD FOR MANUFACTURING THE SAME, DISPLAY SUBSTRATE

CROSS-REFERENCE TO RELATED APPLICATION

This application is a national phase entry under 35 USC 371 of International Patent Application No. PCT/CN2022/128442, filed on Oct. 28, 2022, which is incorporated herein by reference in its entirety.

TECHNICAL FIELD

The present disclosure relates to the field of display technologies, and in particular, to a light-emitting device and a method for manufacturing the same, and a display substrate.

BACKGROUND

Quantum dot light-emitting diode (QLED) devices have gained extensive attention in the display field due to high color gamut, self-illumination, low turn-on voltage, fast response and other advantages. The basic working principle of the quantum dot light-emitting diode device is that electrons and holes are respectively injected into two sides of the quantum dot light-emitting layer respectively, and these electrons and holes recombine in the quantum dot light-emitting layer to form photons, and finally emit light through the photons.

SUMMARY

In an aspect, a light-emitting device is provided. The light-emitting device includes a first electrode, an electron transport layer, a light-emitting layer, a hole transport layer and a second electrode that are arranged sequentially. The electron transport layer includes at least one electron transport sub-layer; and in the at least one electron transport sub-layer, an electron transport sub-layer closest to the light-emitting layer is an electron transport sub-layer with a C-axis orientation. The C-axis orientation is a direction perpendicular to a plane where the light-emitting layer is located. In the electron transport sub-layer with the C-axis orientation, in the direction perpendicular to the plane where the light-emitting layer is located, a ratio of a number of crystal grains having no overlap with adjacent crystal grains to a total number of crystal grains is greater than 85%.

In some embodiments, in the electron transport sub-layer with the C-axis orientation, in a first direction, a ratio of a number of crystal grains, each crystal grain of which has a distance from an adjacent crystal grain smaller than a size of the crystal grain itself, to the total number of crystal grains is greater than 50%. The first direction is parallel to the plane where the light-emitting layer is located.

In some embodiments, the electron transport layer is composed of one electron transport sub-layer. The single electron transport sub-layer is the electron transport sub-layer with the C-axis orientation, and a film thickness of the electron transport sub-layer with the C-axis orientation is in a range of 30 nm to 90 nm, inclusive.

In some embodiments, the electron transport layer is composed of two electron transport sub-layers. In the two electron transport sub-layers, an electron transport sub-layer proximate to the light-emitting layer is the electron transport sub-layer with the C-axis orientation, and another electron transport sub-layer away from the light-emitting layer is an electron transport sub-layer with a non-C-axis orientation. A film thickness of each electron transport sub-layer in the electron transport layer is in a range of 15 nm to 40 nm, inclusive.

In some embodiments, the electron transport layer includes at least three electron transport sub-layers. In the at least three electron transport sub-layers, the electron transport sub-layer closest to the light-emitting layer is the electron transport sub-layer with the C-axis orientation, an electron transport sub-layer closest to the first electrode is an electron transport sub-layer with the C-axis orientation or an electron transport sub-layer with a non-C-axis orientation, and an electron transport sub-layer disposed between the electron transport sub-layer closest to the light-emitting layer and the electron transport sub-layer closest to the first electrode is an electron transport sub-layer with the non-C-axis orientation.

In some embodiments, the electron transport layer is composed of three electron transport sub-layers. A film thickness of each electron transport sub-layer in the electron transport layer is in a range of 10 nm to 30 nm, inclusive.

In some embodiments, a ratio of a thickness of an electron transport sub-layer in a middle of the three electron transport sub-layers to a total thickness of the electron transport layer is in a range of 0.23 to 0.35, inclusive.

In some embodiments, the electron transport sub-layer closest to the first electrode is the electron transport sub-layer with the C-axis orientation; and the electron transport sub-layer with the C-axis orientation closest to the light-emitting layer has a larger degree of C-axis orientation than the electron transport sub-layer with the C-axis orientation closest to the first electrode.

In some embodiments, same atoms included in a material of each electron transport sub-layer are oxygen atoms and zinc atoms.

In some embodiments, the electron transport layer includes at least two electron transport sub-layers. The electron transport sub-layer closest to the light-emitting layer has a lower oxygen vacancy proportion than any remaining electron transport sub-layer.

In some embodiments, an oxygen vacancy proportion of the electron transport sub-layer closest to the light-emitting layer is lower by 5% to 25% than an oxygen vacancy proportion of any remaining electron transport sub-layer.

In some embodiments, a LUMO energy level of the electron transport sub-layer closest to the light-emitting layer is closer to a LUMO energy level of the light-emitting layer than a LUMO energy level of any remaining electron transport sub-layer.

In some embodiments, the electron transport layer includes three electron transport sub-layers; an electron transport sub-layer in a middle further includes dopant atoms, and the dopant atoms include at least one of magnesium, gallium, and boron nitride.

In some embodiments, a conduction band energy level of the electron transport sub-layer containing the dopant atoms is shallower than a conduction band energy level of an electron transport sub-layer not containing dopant atoms.

In some embodiments, a material of the electron transport layer is at least one of inorganic materials, and each electron transport sub-layer in the electron transport layer is not provided with a ligand material.

In some embodiments, the light-emitting device further includes an intermediate layer disposed between the light-emitting layer and the electron transport sub-layer closest to the light-emitting layer. A material of the intermediate layer is an organic matter or a polymer, and the material of the intermediate layer fills pores between adjacent crystal grains of the electron transport sub-layer closest to the light-emitting layer.

In some embodiments, the light-emitting device has an inverted structure, and a face of each electron transport sub-layer in the electron transport layer away from the first electrode has a surface roughness in a range of 0.5 nm to 2 nm. Alternatively, the light-emitting device has an upright structure, and a face of each electron transport sub-layer in the electron transport layer away from the second electrode has a surface roughness in a range of 0.5 nm to 2 nm.

In another aspect, a method for manufacturing a light-emitting device is provided. The method includes: forming a first electrode; forming an electron transport layer on the first electrode; forming a light-emitting layer on the electron transport layer; forming a hole transport layer on the light-emitting layer; and forming a second electrode on the hole transport layer. Alternatively, the method includes: forming a second electrode; forming a hole transport layer on the second electrode; forming a light-emitting layer on the hole transport layer; forming an electron transport layer on the light-emitting layer; and forming a first electrode on the electron transport layer. The electron transport layer includes at least one electron transport sub-layer. In the at least one electron transport sub-layer, an electron transport sub-layer closest to the light-emitting layer is an electron transport sub-layer with a C-axis orientation. The C-axis orientation is a direction perpendicular to a plane where the light-emitting layer is located. In the electron transport sub-layer with the C-axis orientation, in the direction perpendicular to the plane where the light-emitting layer is located, a ratio of a number of crystal grains having no overlap with adjacent crystal grains to a total number of crystal grains is greater than 85%.

In some embodiments, forming the electron transport sub-layer closest to the light-emitting layer includes: forming the electron transport sub-layer with the C-axis orientation by using a magnetron sputtering process.

Forming the electron transport sub-layer with the C-axis orientation, includes: depositing a material of an electron transport sub-layer under a first temperature of a base by using the magnetron sputtering process, so as to form the electron transport sub-layer with the C-axis orientation, wherein the first temperature is a temperature of the base that enables the material to have the C-axis orientation, and is an ordinary temperature; or depositing the material of the electron transport sub-layer under a second temperature of the base by using the magnetron sputtering process, and annealing the material of the electron transport sub-layer at the second temperature, so as to form the electron transport sub-layer with the C-axis orientation, wherein the second temperature is a temperature of the base that enables the material to have the C-axis orientation, and is in a range of 200° C. to 500° C.; or depositing the material of the electron transport sub-layer under a second sputtering power by using the magnetron sputtering process, so as to form the electron transport sub-layer with the C-axis orientation, wherein the second sputtering power is a sputtering power that enables the material to have the C-axis orientation.

In some embodiments, the at least one electron transport sub-layer further includes an electron transport sub-layer with a non-C-axis orientation. Forming the electron transport sub-layer with the non-C-axis orientation, includes: depositing a material of an electron transport sub-layer under a third temperature of a base by using the magnetron sputtering process, so as to form the electron transport sub-layer with the non-C-axis orientation, wherein the third temperature is a temperature of the base that enables the material to have the non-C-axis orientation; or depositing the material of the electron transport sub-layer under a first sputtering power by using the magnetron sputtering process, so as to form the electron transport sub-layer with the non-C-axis orientation, wherein the first sputtering power is a sputtering power that enables the material to have the non-C-axis orientation.

In another aspect, a display substrate is provided. The display substrate includes a plurality of light-emitting devices each according to any of the above embodiments.

In some embodiments, the display substrate further includes a substrate and a pixel defining layer disposed on a side of the substrate, and the pixel defining layer includes a plurality of openings. First electrodes of the plurality of light-emitting devices are located between the substrate and the pixel defining layer. Each opening exposes at least a part of a first electrode of a light-emitting device, and an electron transport layer, a light-emitting layer, a hole transport layer and a second electrode of the light-emitting device are arranged sequentially on the first electrode and located in the opening. The electron transport layer of the light-emitting device is located in the opening, and electron transport layers of the plurality of light-emitting devices are not in contact with each other. Alternatively, the display substrate includes an electron transport film layer disposed on a side of both the pixel defining layer and first electrodes of the plurality of light-emitting devices away from the substrate. Portions of the electron transport film layer located in the plurality of openings are electron transport layers of the plurality of light-emitting devices. An electron transport layer of each light-emitting device includes a first portion disposed on a side of a light-emitting layer and a second portion disposed on a sidewall of an opening, and the electron transport layers of the plurality of light-emitting devices are in contact with each other.

In some embodiments, the display substrate further includes a substrate and a pixel defining layer disposed on a side of the substrate, and the pixel defining layer includes a plurality of openings. Second electrodes of the plurality of light-emitting devices are located between the substrate and the pixel defining layer. Each opening exposes at least a part of a second electrode of a light-emitting device, and a hole transport layer, a light-emitting layer, an electron transport layer and a first electrode of the light-emitting device are arranged sequentially on the second electrode and located in the opening. The electron transport layer of the light-emitting device is located in the opening, and electron transport layers of the plurality of light-emitting devices are not in contact with each other. Alternatively, the display substrate includes an electron transport film layer disposed on a side of both the pixel defining layer and light-emitting layers of the plurality of light-emitting devices away from the substrate. Portions of the electron transport film layer located in the plurality of openings are electron transport layers of the plurality of light-emitting devices. An electron transport layer of each light-emitting device includes a first portion disposed on a side of a light-emitting layer and a second portion disposed on a sidewall of an opening, and the electron transport layers of the plurality of light-emitting devices are in contact with each other.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method and an actual timing of a signal to which the embodiments of the present disclosure relate.

FIG. 16 is a flow diagram of yet another method for manufacturing a light-emitting device, in accordance with some embodiments of the present disclosure;

FIG. 17A is a flow diagram of yet another method for manufacturing a light-emitting device, in accordance with some embodiments of the present disclosure;

DETAILED DESCRIPTION

Figure 1A:
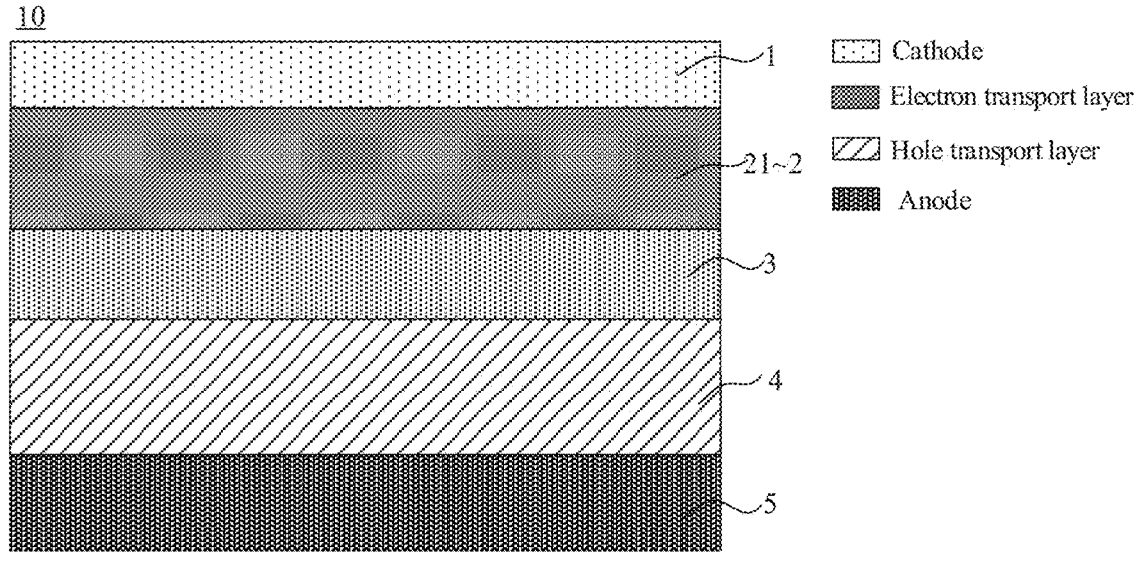
FIG. 1A is a diagram showing an upright structure of a light-emitting device, in accordance with some embodiments of the present disclosure.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, term "a plurality of" or "the plurality of" means two or more unless otherwise specified.

In the description of some embodiments, the expressions "coupled" and "connected" and derivatives thereof may be used. The term "connected" should be understood in a broad sense. For example, the term "connection" may be a fixed connection, a detachable connection, or an integral structure; it may be a direct connection or an indirect connection through an intermediary. For example, the term "coupled" indicates that two or more components are in direct physical or electrical contact. However, the term "coupled" or "communicatively coupled" may also indicate that two or more components are not in direct contact with each other, but still cooperate or interact with each other. The embodiments disclosed herein are not necessarily limited to the context herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining that" or "in response to detecting", depending on the context. Similarly, the phrase "if it is determined that" or "if [a stated condition or event] is detected" is optionally construed as "in a case where it is determined that" or "in response to determining that" or "in a case where [the stated condition or event] is detected" or "in response to detecting [the stated condition or event]", depending on the context.

The phrase "applicable to" or "configured to" as used herein indicates an open and inclusive expression, which does not exclude apparatuses that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

The term "about", "substantially" or "approximately" as used herein includes a stated value and an average value within an acceptable range of deviation of a particular value. The acceptable range of deviation is determined by a person of ordinary skill in the art in consideration of the measurement in question and errors associated with the measurement of a particular quantity (i.e., limitations of the measurement system).

The term such as "parallel", "perpendicular" or "equal" as used herein includes a stated condition and a condition similar to the stated condition. A range of the similar condition is within an acceptable range of deviation. The acceptable range of deviation is determined by a person of ordinary skill in the art in view of measurement in question and errors associated with the measurement of a particular quantity (i.e., limitations of the measurement system). For example, the term "parallel" includes absolute parallelism and approximate parallelism, and an acceptable range of deviation of the approximate parallelism may be a deviation within 5°; the term "perpendicular" includes absolute perpendicularity and approximate perpendicularity, and an acceptable range of deviation of the approximate perpendicularity may also be a deviation within 5°; and the term "equal" includes absolute equality and approximate equality, and an acceptable range of deviation of the approximate equality may be a difference between two equals being less than or equal to 5% of either of the two equals.

It will be understood that when a layer or element is referred to as being on another layer or substrate, the layer or element may be directly on the another layer or substrate, or there may be intermediate layer(s) between the layer or element and the another layer or substrate.

Exemplary embodiments are described herein with reference to sectional views and/or plan views as idealized exemplary drawings. In the accompanying drawings, thicknesses of layers and sizes of regions are enlarged for clarity.

Variations in shapes relative to the accompanying drawings due to, for example, manufacturing technologies and/or tolerances may be envisaged. Therefore, the exemplary embodiments should not be construed to be limited to the shapes of regions shown herein, but to include deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of the regions in an apparatus, and are not intended to limit the scope of the exemplary embodiments.

As a new type of luminescent material, quantum dots (QD) have high light color purity, high luminous quantum efficiency, adjustable luminous color, long service life, and other advantages, and have become a research hotspot for new light-emitting diode (LED) materials at present. Therefore, a quantum dot light-emitting diode (QLED) with the quantum dot material as the light-emitting layer has become a main direction of research for new display devices.

With improvement of the consumption level of consumers, high-resolution products have become a key development direction of display products. However, since active matrix electroluminescent quantum dot light-emitting display diode (also referred to as active electroluminescent quantum dot light-emitting diode, AMQLED) products with high-resolution and full-color need to be manufactured by mask evaporation, which has a certain problem of alignment accuracy, it is necessary to further reduce a mask process line width of an evaporation mask of an organic light-emitting diode (OLED). Therefore, it is impossible to achieve a small area of light emission, which limits further improvement of the resolution.

Moreover, AMQLED has received more and more attention due to its potential advantages in wide color gamut and long life. The research on AMQLED has become more and more in-depth. The efficiency of quantum dots has been continuously improved and has basically reached the level of industrialization, and further use of a new process and technology has great significance. Due to the characteristics of the quantum dot material itself, the quantum dot material is generally formed using a printing technology or a printing method, which may effectively improve the utilization rate of the material, and provide an effective way for large-area preparation. For a high-resolution backplane, due to a small size of a pixel definition area, there are extremely high requirements for accuracy and stability of the device.

In the prior art, a bottom common layer film of the light-emitting device is used to be coated with the photoresist material, and three sub-pixel light-emitting layers of red, green and blue are each formed after exposure and development, and then a top common layer is deposited. In a case of using such a structure for high resolution, since a distance between sub-pixels is relatively small, there will be serious signal crosstalk between different sub-pixels. As a result, the display effect of the device will be affected. In order to cooperate with the wet film-forming process of quantum dots, an inverted device structure is commonly used. The bottom layer is an electron transport layer formed by a sputtering process, which may effectively avoid solution erosion. Then, since the sputtered film is usually in an amorphous state, its electric conductivity is isotropic, and its electric conductivity is very high in all directions. Therefore, it is prone to form a lateral current, which refers to a current in a direction in a plane where the film is located, and thus results in signal crosstalk.

In light of this, some embodiments of the present disclosure provide a light-emitting device and a method for manufacturing the same, and a display substrate. The light-emitting device 10 may effectively solve the problem of side electric leakage and signal crosstalk caused by too high lateral electric conductivity of the electron transport layer.

The light-emitting device and the method for manufacturing the same, and the display substrate provided in the embodiments of the present disclosure will be introduced below.

Figure 1B:
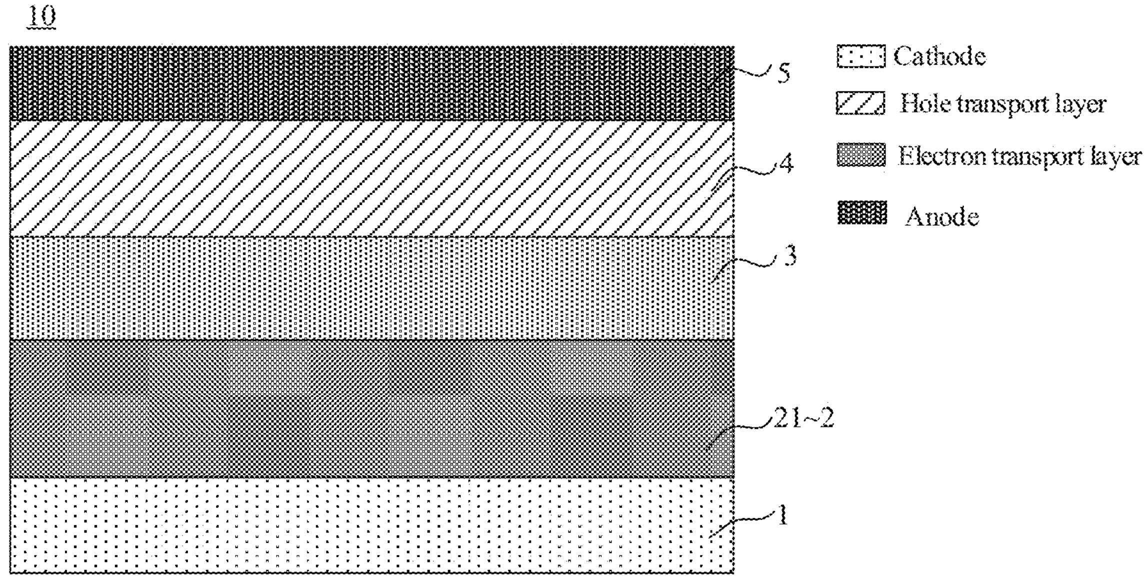
FIG. 1B is a diagram showing an inverted structure of another light-emitting device, in accordance with some embodiments of the present disclosure.
Figure 1C:
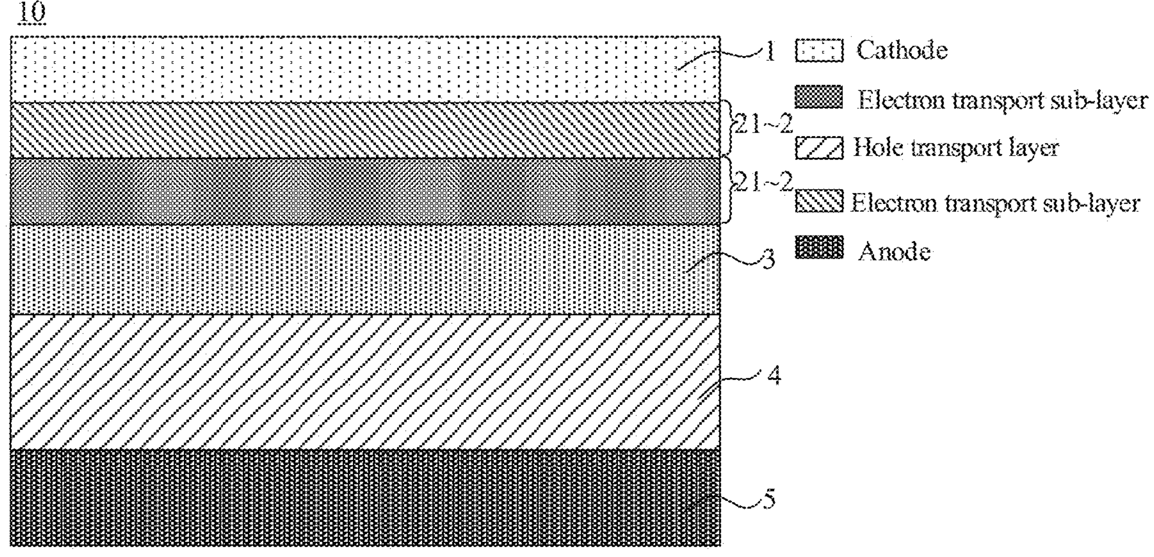
FIG. 1C is a diagram showing an upright structure of yet another light-emitting device, in accordance with some embodiments of the present disclosure.
Figure 1D:
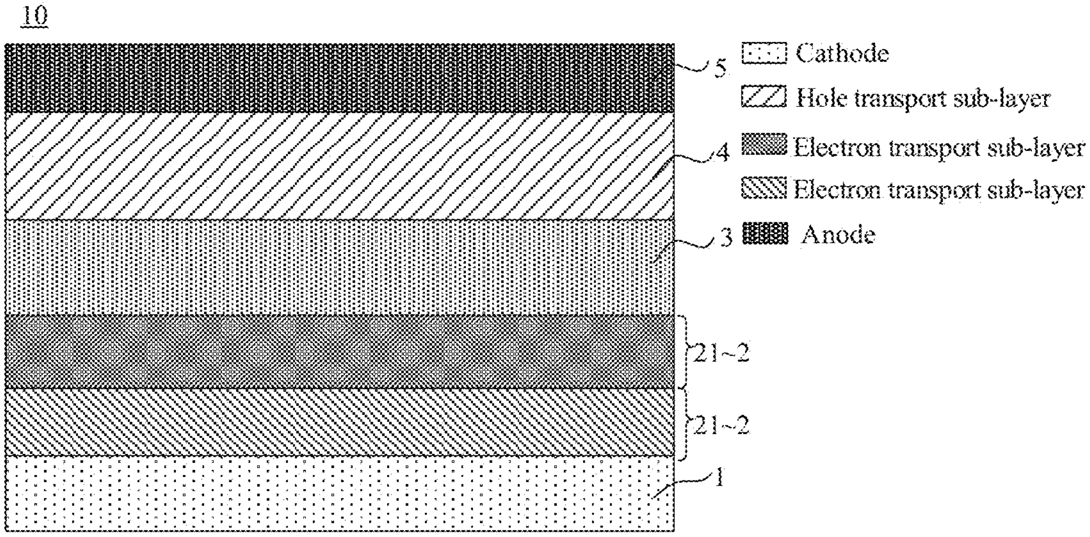
FIG. 1D is a diagram showing an inverted structure of yet another light-emitting device, in accordance with some embodiments of the present disclosure.

In some embodiments of the present disclosure, as shown in FIGS. 1A to 1D, the light-emitting device 10 includes a first electrode 1, an electron transport layer 2, a light-emitting layer 3, a hole transport layer 4 and a second electrode 5 that are stacked in sequence. As shown in FIGS. 1C and 1D, the electron transport layer 2 includes at least one electron transport sub-layer 21, and an electron transport sub-layer 21, closest to the light-emitting layer 3, in the at least one electron transport sub-layer 21 is an electron transport sub-layer with a C-axis orientation.

The C-axis orientation is a direction perpendicular to a plane where the light-emitting layer 3 is located. In the electron transport sub-layer with the C-axis orientation, in a first direction X, a ratio of the number of crystal grains, each of which has a distance from an adjacent crystal grain smaller than a size of the crystal grain itself, to the total number of crystal grains is greater than 50%. For example, the ratio may be 60%, 70%, 80%, 90% or 95%. The first direction X is parallel to the plane where the light-emitting layer 3 is located. In the direction perpendicular to the plane where the light-emitting layer 3 is located, a ratio of the number of crystal grains having no overlap with adjacent crystal grains, to the total number of crystal grains is greater than 85%. For example, the ratio may be 90% or 95%.

For example, the light-emitting device 10 may be inverted or upright. The first electrode 1 is an anode, and the second electrode 5 is a cathode. As shown in FIGS. 1A and 1C, in a case where the light-emitting device 10 is upright, the first electrode 1 is a top electrode, and the second electrode 5 is a bottom electrode. As shown in FIGS. 1B and 1D, in a case where the light-emitting device 10 is inverted, the first electrode 1 is a bottom electrode, and the second electrode 5 is a top electrode. The stacking manner of the light-emitting device 10 here has no limitation on an upright or inverted structure.

Figure 2A:
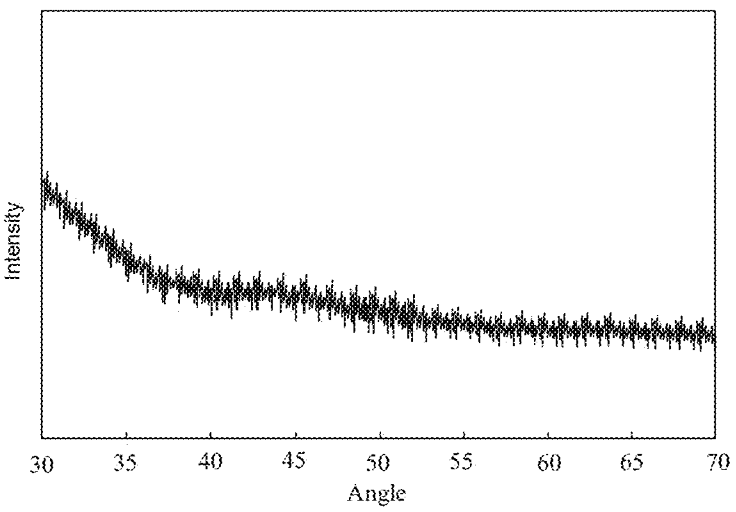
FIG. 2A is an X-ray diffraction (XRD) test result diagram of an amorphous electron transport layer, in accordance with some embodiments of the present disclosure.
Figure 2B:
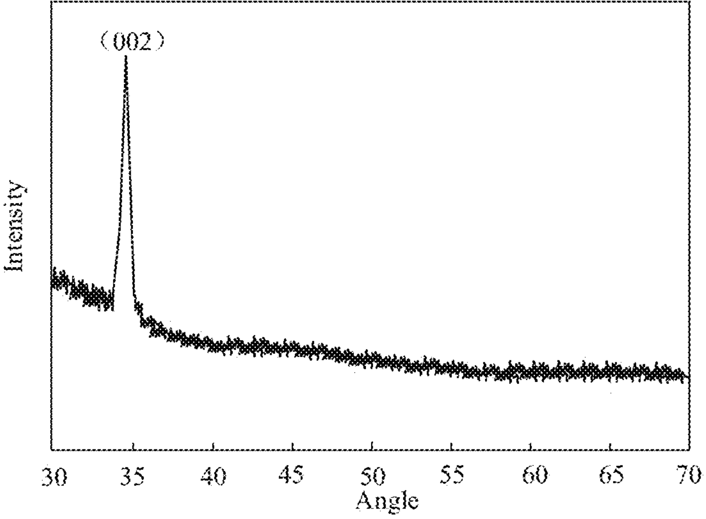
FIG. 2B is an XRD test result diagram of an electron transport sub-layer with a C-axis orientation, in accordance with some embodiments of the present disclosure.

It will be noted that the electron transport sub-layer 21 closest to the light-emitting layer 3 is an electron transport sub-layer with a C-axis orientation. As shown in FIG. 2A, which is an X-ray diffraction (XRD) test result of an amorphous (i.e., with a non-C-axis orientation) electron transport layer. There is no obvious characteristic diffraction signal peak in the result, which indicates that the amorphous electron transport layer is in an amorphous state as a whole and is isotropic. Referring to FIG. 2B, which is an XRD test result of the electron transport sub-layer with the C-axis orientation, compared with the amorphous electron transport layer, there is an obvious characteristic diffraction signal peak in the result, and the signal represents a (002) crystal plane. Therefore, it is indicated that the electron transport sub-layer with the C-axis orientation is generally in an amorphous state in directions other than the vertical direction, for example, in an amorphous state in horizontal direction, but has obvious crystallinity in the vertical direction. The vertical direction is along the C-axis, that is, the direction perpendicular to the plane where the light-emitting layer 3 is located, and the horizontal direction is a direction parallel to the plane where the light-emitting layer 3 is located.

Figure 2C:
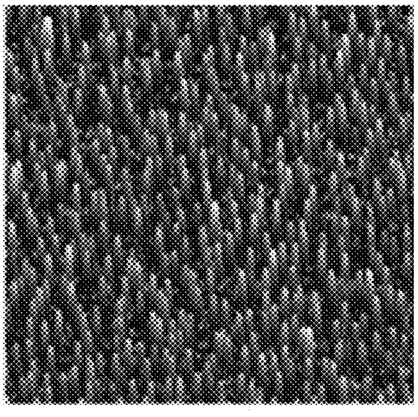
FIG. 2C is an atomic force microscope (AFM) test result diagram of an electron transport sub-layer with a C-axis orientation, in accordance with some embodiments of the present disclosure.
Figure 2D:
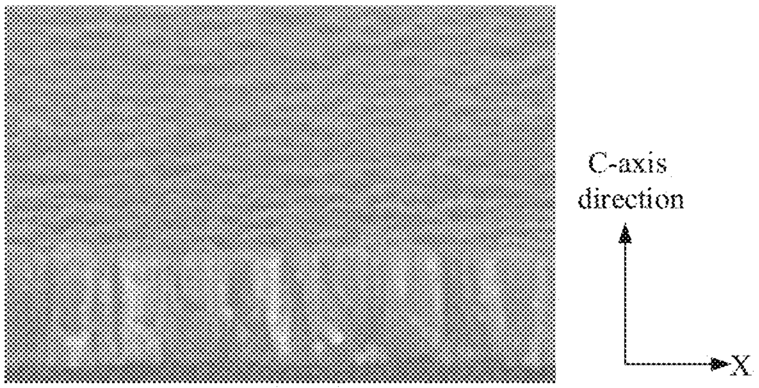
FIG. 2D is an AFM test result diagram of an electron transport sub-layer with a C-axis orientation, in accordance with some embodiments of the present disclosure.
Figure 2E:
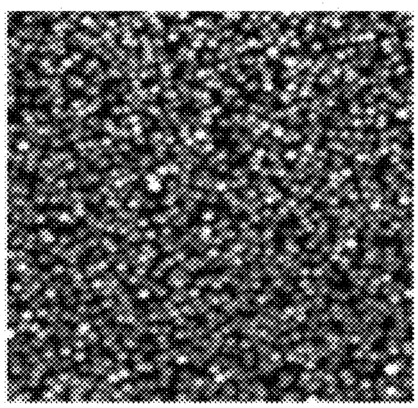
FIG. 2E is an AFM test result diagram of an electron transport sub-layer with a C-axis orientation, in accordance with some embodiments of the present disclosure.
Figure 2F:
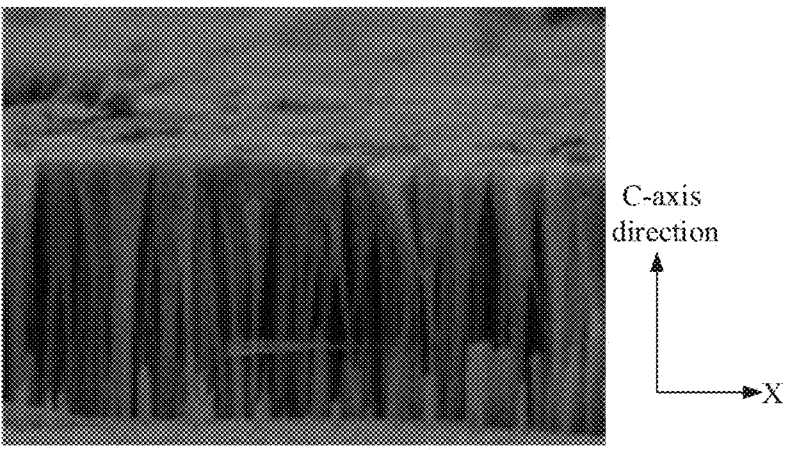
FIG. 2F is an AFM test result diagram of an electron transport sub-layer with a C-axis orientation, in accordance with some embodiments of the present disclosure.

In the electron transport layer with the non-C-axis orientation, the amorphous electron transport sub-layer film has relatively large electric conductivities in all directions, and the electric conductivity is in an order of magnitudes of $10^3$ to $10^6$ Ω/cm. By considering the nanoparticle type electron transport layer film as an example, the resistance thereof in each direction is in a range of $10^7$ Ω/cm to $10^8$ Ω/cm. In addition to the current in the vertical direction, there is also side leakage of electrons. In addition to causing large electric leakage of electrons, the side leakage of electrons will also cause signal crosstalk of the light-emitting devices. Referring to FIGS. 2C, 2D. 2E and 2F, which are the atomic force microscope (AFM) test results diagrams of the electron transport sub-layer with the C-axis orientation, the C-axis orientation is a direction perpendicular to the plane where the light-emitting layer 3 is located. It can be seen that the electron transport sub-layer with the C-axis orientation has obvious crystallinity in the C axis. Therefore, the electron transport sub-layer with the C-axis orientation has a good electric conductivity in this direction, while has a poor electric conductivity in the horizontal directions due to the obvious crystal grain boundaries. The horizontal directions here are directions parallel to the plane where the light-emitting layer 3 is located, and the first direction X is one of the horizontal directions. Through test, the electric conductivity of the electron transport sub-layer with the C-axis orientation in the vertical direction is similar to that of the amorphous electron transport sub-layer film, and is about in the order of magnitudes of $10^3$ to $10^6$ Ω/cm, while the electric conductivity of the film in the horizontal directions decrease sharply, and is about in the order of magnitudes of $10^{12}$ to $10^{14}$ Ω/cm. It can be seen that in the electron transport sub-layer with the C-axis orientation, a ratio of the electric conductivity of the (002) crystal plane in the vertical direction to that in the horizontal direction is in a range of $10^6$ to $10^{11}$. Therefore, the light-emitting device provided by some embodiments of the present disclosure includes the electron transport sub-layer with the C-axis orientation disposed proximate to the light-emitting layer, the electric conductivity of the electron transport sub-layer in the direction perpendicular to the plane where the light-emitting layer 3 is located is greater than the electric conductivity of the electron transport sub-layer in the direction parallel to the plane where the light-emitting layer 3 is located, and the ratio of the electric conductivity of the electron transport sub-layer in the direction perpendicular to the plane where the light-emitting layer 3 is located to the electric conductivity of the electron transport sub-layer in the direction parallel to the plane where the light-emitting layer 3 is locate is in a range of $10^6$ to $10^{11}$. Therefore, electrons are transmitted vertically from the first electrode to the light-emitting layer without leaking to the side, thereby avoiding large electric leakage of electrons and crosstalk problems.

Figure 3A:
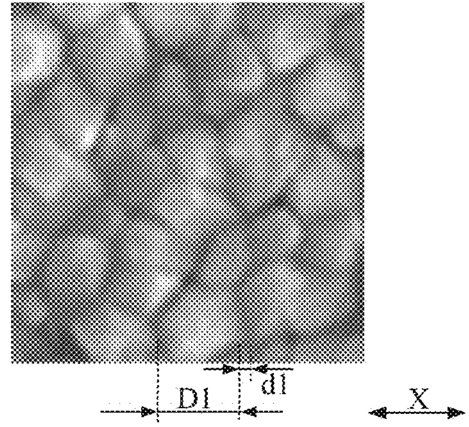
FIG. 3A is a cross-sectional view of a sputtered type electron transport layer film with a C-axis orientation, in accordance with some embodiments of the present disclosure.
Figure 3B:
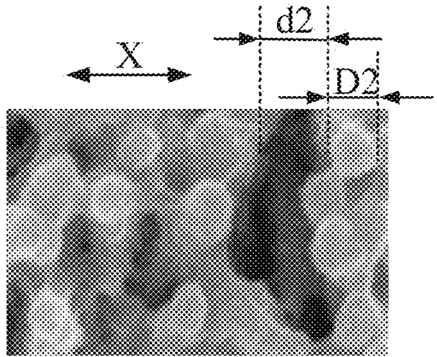
FIG. 3B is a cross-sectional view of an electrochemically deposited type electron transport layer film with a C-axis orientation, in accordance with some embodiments of the present disclosure.

For example, the electron transport layer 2 is a sputtering type electron transport layer, that is, the electron transport layer is formed by a sputtering process. Alternatively, the electron transport layer 2 is an electrochemically deposited type electron transport layer, that is, the electron transport layer is formed by an electrochemical deposited process. Referring to FIGS. 3A and 3B, FIG. 3A is a cross-sectional view of a sputtered type electron transport layer film with the C-axis orientation, and FIG. 3B is a cross-sectional view of an electrochemically deposited type electron transport layer film with the C-axis orientation. It can be seen from FIGS. 3A and 3B that the crystal grains in the sputtered type electron transport layer film with the C-axis orientation in FIG. 3A all extend along the C-axis direction, a distance between adjacent crystal grains in the direction X is smaller a distance between adjacent crystal grains in the electrochemically deposited type electron transport layer film with the C-axis orientation in FIG. 3B in the direction X, and the verticality of crystal grains in the sputtered type electron transport layer film with the C-axis orientation in FIG. 3A is better than that in the electrochemically deposited type electron transport layer film with the C-axis orientation in FIG. 3B.

As shown in FIG. 3A, the sputtered type electron transport layer with the C-axis orientation has obvious grain boundaries in the first direction X, and thus the conductivity thereof in the horizontal directions is low. According to FIG. 3A, a test region with an area of 1 square micron is selected from the sputtered type electron transport layer with the C-axis orientation, and sizes and distances of crystal grains in the test region are measured. It can be seen that a distance d1 between adjacent crystal grains in some crystal grains in the first direction X is smaller than a size D1 of the grain itself in the first direction X. The smaller the distance between adjacent crystal grains, the more compact the crystal grains, and the less the pores. It can be obtained by calculation that in the test region, in the first direction X, the number of crystal grains each having a distance from an adjacent crystal grain smaller than the size of the crystal grain itself is m, the total number of crystal grains in the test region is M, and a ratio of m to M (i.e., m/M) is greater than 50%. For example, the ratio of m to M (i.e., m/M) may be 60%, 70%, 80% %, 90% or 95%. It can be extended to the whole electron transport layer with the C-axis orientation, and the ratio of the number of the crystal grains each having a distance from an adjacent crystal grain smaller than a size of the crystal grain itself to the total number of crystal grains is greater than 50%. It can be seen that in the sputtered type electron transport layer with the C-axis orientation, the distance between adjacent crystal grains in most crystal grains is small. In this way, it may avoid longitudinal electric leakage. If the distance is too large, the distances between all the crystal grains are relatively large, and there are more pores. As a result, there may be more electric leakage paths after formation of the light-emitting device, and the electric leakage of the light-emitting device is rather large. Therefore, the film layer has a relatively good electric conductivity in the vertical direction and has a relatively few electric leakage paths. Referring to FIGS. 2C, 2D, 2E and 2F, the relationship of sizes of crystal grains in the electron transport layer described above may be reflected in the cross-sectional views of the film layer shown in FIGS. 2D and 2F and the plan views of the film layer shown in FIGS. 2C and 2E.

Moreover, the crystal grains of the sputtered type electron transport layer have good verticality. Similarly, a test region with an area of 1 square micron is selected from the electron transport layer with the C-axis orientation, and the overlap condition of the crystal grains in the test region is measured and calculated. It can be seen that in the test region, in the direction perpendicular to the plane where the light-emitting layer 3 is located, the ratio of the number of crystal grains having no overlap with adjacent crystal grains to the total number of crystal grains in the test region is greater than 85%. For example, the ratio may be 90% or 95%. It can be extended to the whole electron transport layer with the C-axis orientation, and the ratio of the number of crystal grains having no overlap with adjacent crystal grains to the total number of crystal grains is greater than 85%. It indicates that the ratio of crystal grains that do not overlap with each other is relatively high, most crystal grains extend along the C axis, and the inclination degree is low. Referring to FIGS. 2C, 2D, 2E and 2F, the overlap relationship of crystal grains described above may be reflected in the cross-sectional views of the film layer shown in FIGS. 2D and 2F and the plan views of the film layer shown in FIGS. 2C and 2E. As shown in FIG. 3B, a distance d2 between adjacent crystal grains in the electrochemical deposited type electron transport layer with the C-axis orientation in the first direction X is relatively large, the distance d2 between adjacent crystal grains in the first direction X is larger than a size D2 of the crystal grain itself in the first direction X, and the number of crystal grains each overlapped with an adjacent crystal grain is rather large. The verticality of the crystal grains is relatively low, and there are more pores in the film layer. In this way, there may be more electric leakage paths after the film layer is applied in the light-emitting device, which makes the electric leakage of the device rather large. Therefore, in the embodiments of the present disclosure, the sputtered electron transport layer film with the C-axis orientation shown in FIG. 3A is preferred, and the sputtering preparation process is relatively simple.

The following will introduce a variety of embodiments of the electron transport layer 2 in the light-emitting device. The light-emitting device may be an upright light-emitting device or an inverted light-emitting device. The referenced accompanying drawings all take the inverted light-emitting device as an example. The structure of the upright light-emitting device may refer to the drawings and related introduction of the inverted light-emitting device.

In some embodiments, the electron transport layer 2 includes one electron transport sub-layer. The electron transport sub-layer 21 is an electron transport sub-layer with a C-axis orientation, and a film thickness of the electron transport sub-layer with the C-axis orientation is in a range of 30 nm to 90 nm, inclusive.

Figure 4A:
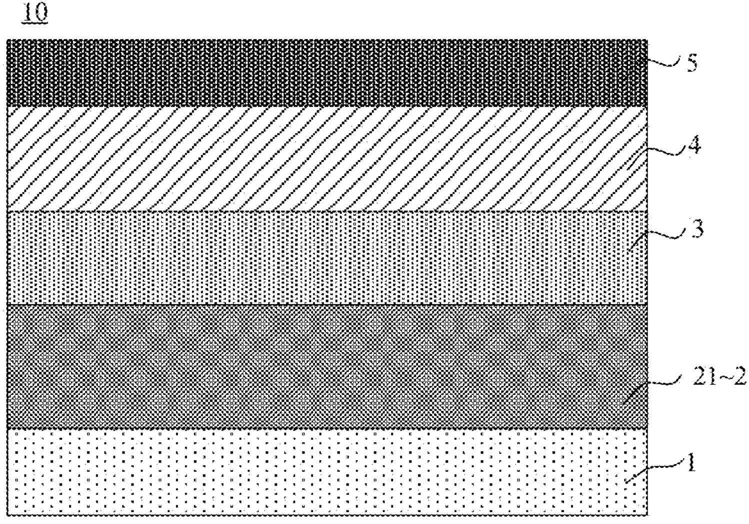
FIG. 4A is a diagram showing an inverted structure of a light-emitting device, in accordance with some embodiments of the present disclosure.
Figure 4B:
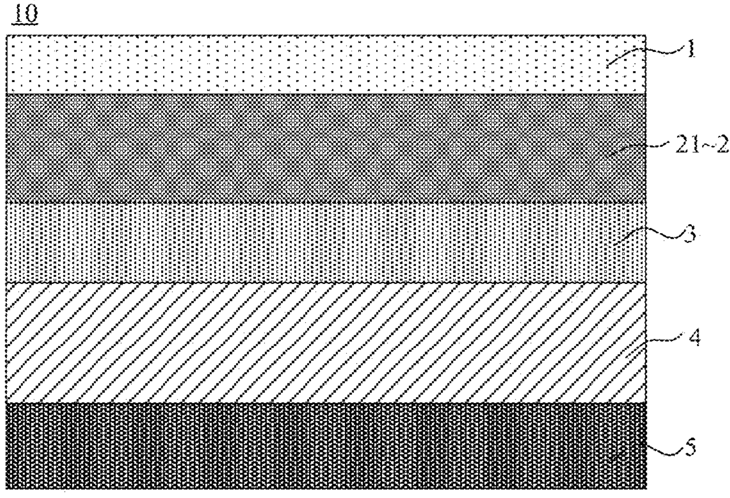
FIG. 4B is a diagram showing an upright structure of a light-emitting device, in accordance with some embodiments of the present disclosure.

In some examples, as shown in FIGS. 4A and 4B, the electron transport layer 2 is composed of one electron transport sub-layer 21, and the electron transport sub-layer is an electron transport sub-layer with a C-axis orientation, that is, the electron transport sub-layer with the C-axis orientation is located between the first electrode 1 and the light-emitting layer. In addition to the simple manufacturing process of the electron transport layer with the C-axis orientation, the provision of the electron transport layer with the C-axis orientation may also weaken the electric conductivity thereof in the horizontal direction due to the good electric conductivity of the electron transport sub-layer with the C-axis orientation in the vertical direction and the poor electric conductivity of the electron transport sub-layer with the C-axis orientation in the horizontal direction, thereby suppressing the side electric leakage phenomenon of the light-emitting device 10.

The film thickness of the electron transport sub-layer with the C-axis orientation is in the range of 30 nm to 90 nm, inclusive. For example, the film thickness of the electron transport sub-layer with the C-axis orientation is 30 nm, 50 nm, 70 nm or 90 nm. The film thickness here is not limited.

In some other embodiments, the electron transport layer 2 is composed of two electron transport sub-layers 21. In the two electron transport sub-layers 21, an electron transport sub-layer 21 proximate to the light-emitting layer 3 is set to an electron transport sub-layer with a C-axis orientation, and an electron transport sub-layer 21 away from the light-emitting layer 3 is an electron transport sub-layer with a non-C-axis orientation. A film thickness of each electron transport sub-layer 21 in the electron transport sub-layers 21 is in a range of 15 nm to 40 nm, inclusive.

Figure 5A:
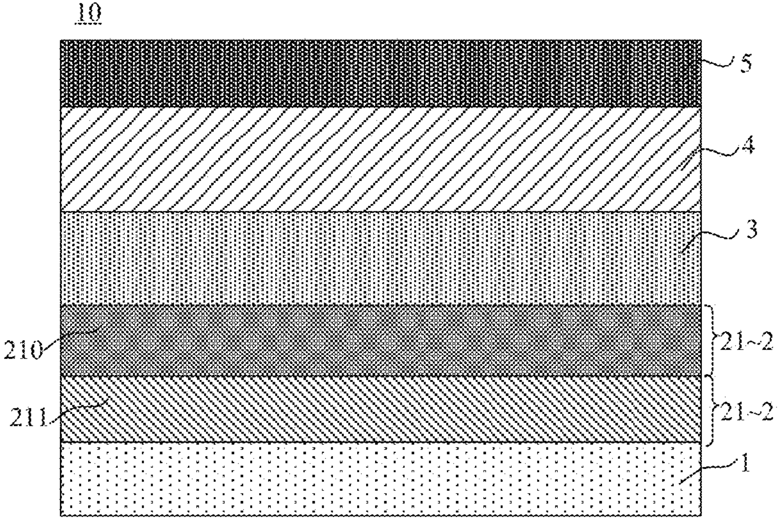
FIG. 5A is a diagram showing an inverted structure of another light-emitting device, in accordance with some embodiments of the present disclosure.
Figure 5B:
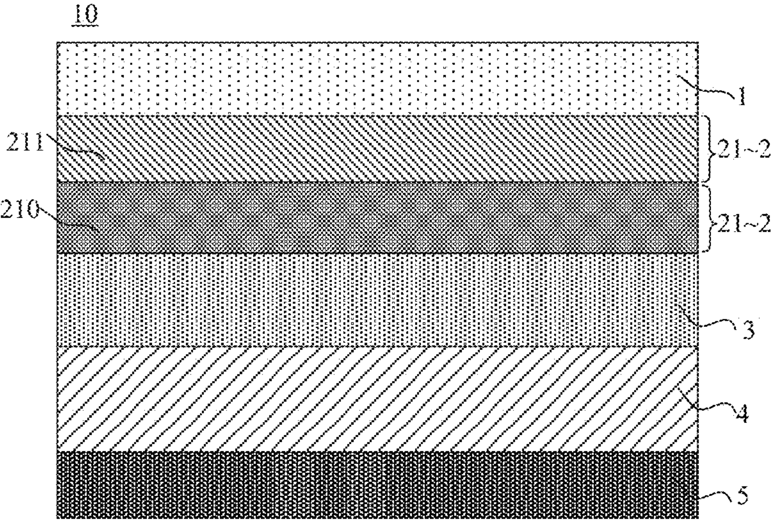
FIG. 5B is a diagram showing an upright structure of another light-emitting device, in accordance with some embodiments of the present disclosure.

In some examples, as shown in FIGS. 5A and 5B, the electron transport layer 2 is composed of two electron transport sub-layers 21, an electron transport sub-layer 21 (i.e., a second electron transport sub-layer 210) proximate to the light-emitting layer 3 is set to an electron transport sub-layer with a C-axis orientation, and an electron transport sub-layer 21 (i.e., a first electron transport sub-layer 211) away from the light-emitting layer 3 is set to an electron transport sub-layer with a non-C-axis orientation. The first electron transport sub-layer and the second electron transport sub-layer are both formed by a sputtering process. Such an arrangement may also suppress the side electric leakage phenomenon of the light-emitting device 10.

The electron transport layer is provided to include two electron transport sub-layers 21. The electron transport sub-layer 21 on the side proximate to the light-emitting layer 3 has the C-axis orientation, and it may be ensured that side electric leakage is suppressed. In addition, an oxygen supplementation or doping operation is performed in a process of forming a certain electron transport sub-layer, so as to weaken the electric conductivity of the electron transport sub-layer in the C-axis direction, which is beneficial to the carrier balance of the light-emitting device. This section will be described in detail in the following contents.

The film thickness of each electron transport sub-layer 21 in the electron transport sub-layers 21 is in the range of 15 nm to 40 nm, inclusive. That is, the film thickness of the electron transport sub-layer with the C-axis orientation and the film thickness of the electron transport sub-layer with the non-C-axis orientation are both in the range of 15 nm to 40 nm, inclusive. For example, the film thickness of the electron transport sub-layer with the C-axis orientation and the film thickness of the electron transport sub-layer with the non-C-axis orientation are each 15 nm, 25 nm, 35 nm or 40 nm. The film thickness here is not limited.

In yet other embodiments, the electron transport layer 2 includes at least three electron transport sub-layers 21. In the at least three electron transport sub-layers, an electron transport sub-layer 21 (i.e., a second electron transport sub-layer 210) closest to the light-emitting layer 3 is an electron transport sub-layer with a C-axis orientation, an electron transport sub-layer (i.e., a first electron transport sub-layer 211) closest to the first electrode 1 is an electron transport sub-layer with a C-axis orientation or an electron transport sub-layer with a non-C-axis orientation, an electron transport sub-layer 21 (i.e., an intermediate electron transport sub-layer 212) provided between the electron transport sub-layer 21 on the side closest to the light-emitting layer 3 and the electron transport sub-layer 21 on the side closest to the first electrode 1 is an electron transport sub-layer with a non-C-axis orientation, and the intermediate electron transport sub-layer 212 includes at least one layer.

Figure 6A:
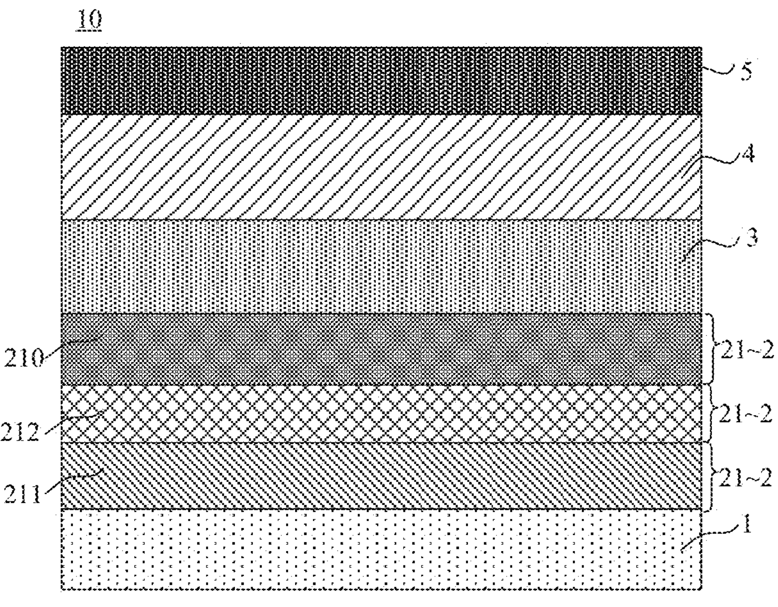
FIG. 6A is a diagram showing an inverted structure of yet another light-emitting device, in accordance with some embodiments of the present disclosure.
Figure 6B:
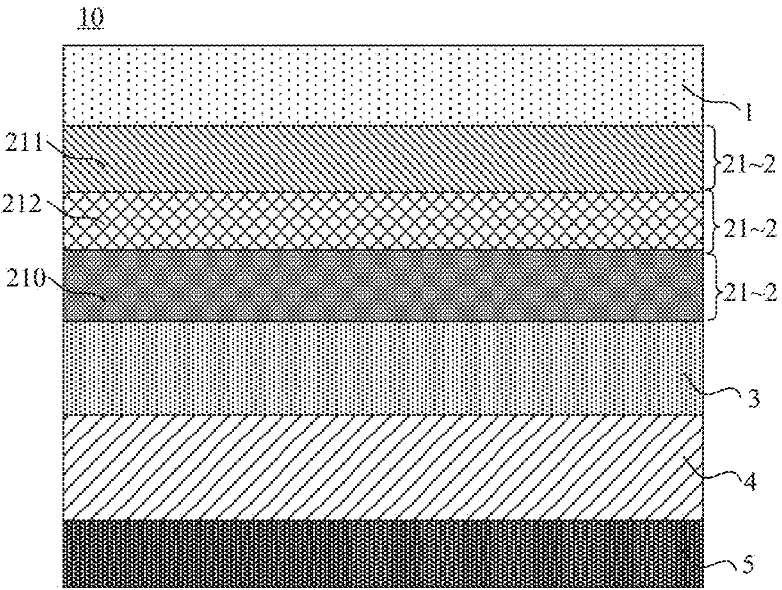
FIG. 6B is a diagram showing an upright structure of yet another light-emitting device, in accordance with some embodiments of the present disclosure.

In some examples, as shown in FIGS. 6A and 6B, the electron transport layer 2 includes three electron transport sub-layers 21. The first electron transport sub-layer 211 closest to the first electrode 1 is an electron transport sub-layer with a C-axis orientation, the second electron transport sub-layer 210 closest to the light-emitting layer 3 is an electron transport sub-layer with a C-axis orientation, and the intermediate electron transport sub-layer 212 provided between the two electron transport sub-layers with the C-axis orientation is an electron transport sub-layer with a non-C-axis orientation.

In some other examples, as shown in FIGS. 6A and 6B, the electron transport layer 2 includes three electron transport sub-layers 21. The first electron transport sub-layer 211 closest to the first electrode 1 is an electron transport sub-layer with a non-C-axis orientation, the second electron transport sub-layer 210 closest to the light-emitting layer 3 is an electron transport sub-layer with a C-axis orientation, and the intermediate electron transport sub-layer 212 provided between the electron transport sub-layer with the C-axis orientation and the electron transport sub-layer with the C-axis orientation is an electron transport sub-layer with a non-C-axis orientation.

The electron transport layer 2 in the above two examples is provided with three electron transport sub-layers 21, and there is electron transport sub-layer(s) with the C-axis orientation provided in the three electron transport sub-layers 21. According to the characteristics of the aforementioned C-axis orientation, such an arrangement may also suppress the side electric leakage phenomenon of the light-emitting device 10.

That is to say, in a case where the electron transport layer includes at least three electron transport sub-layers, it is only needed to ensure that the electron transport sub-layer proximate to the light-emitting layer has the C-axis orientation, and the intermediate electron transport sub-layer 212 has the non-C-axis orientation. The electron transport layer is provided to include the at least three electron transport sub-layers 21. It may be ensured that the electron transport sub-layer 21 on the side proximate to the light-emitting layer 3 has the C-axis orientation and thus plays a role of suppressing side electric leakage. Moreover, an oxygen supplementation or doping operation is performed in a process of forming a certain electron transport sub-layer, so as to weaken the electric conductivity of the electron transport sub-layer in the C-axis direction, which is beneficial to the carrier balance of the light-emitting device. This section will be described in detail in the following contents.

In some embodiments, the electron transport layer 2 includes three electron transport sub-layers 21, and a film thickness of each electron transport sub-layer 21 in the electron transport sub-layers 21 is in a range of 10 nm to 30 nm, inclusive.

In some examples, as shown in FIG. 6A, the electron transport layer 2 is composed of three electron transport sub-layers. A film layer stacked on the first electrode 1 is an electron transport sub-layer with a C-axis orientation, an electron transport sub-layer 21 on the side closest to the light-emitting layer 3 is an electron transport sub-layer with a C-axis orientation, and a film layer provided between the two electron transport sub-layers with the C-axis orientation is an electron transport sub-layer with a non-C-axis orientation. The film thickness of each electron transport sub-layer 21 in the electron transport sub-layers 21 is in the range of 10 nm to 30 nm, inclusive. For example, the film thickness of the electron transport sub-layer with the C-axis orientation and the film thickness of the electron transport sub-layer with the non-C-axis orientation are each 10 nm, 20 nm or 30 nm. The film thickness here is not limited.

In some other examples, with continued reference to FIGS. 6A and 6B, the electron transport layer 2 is composed of three electron transport sub-layers. A film layer stacked on the first electrode 1 is an electron transport sub-layer with a non-C-axis orientation, an electron transport sub-layer 21 on the side closest to the light-emitting layer 3 is an electron transport sub-layer with a C-axis orientation, and a film layer provided between the electron transport sub-layer with the C-axis orientation and the electron transport sub-layer with the non-C-axis orientation is an electron transport sub-layer with a non-C-axis orientation. The film thickness of each electron transport sub-layer 21 in the electron transport sub-layers 21 is in the range of 10 nm to 30 nm, inclusive. For example, the film thickness of the electron transport sub-layer with the C-axis orientation and the film thickness of the electron transport sub-layer with the non-C-axis orientation are each 10 nm, 20 nm or 30 nm. The film thickness here is not limited.

In some embodiments, as shown in FIGS. 6A and 6B, the electron transport sub-layer (the second electron transport sub-layer 210) on the side closest to the light-emitting layer in the electron transport layer 2 and the electron transport sub-layer 21 (the first electron transport sub-layer 211) on the side closest to the first electrode 1 in the electron transport layer 2 are all electron transport sub-layers with the C-axis orientation, and the electron transport sub-layer with the C-axis orientation closest to the light-emitting layer 3 has a larger degree of C-axis orientation than the electron transport sub-layer with the C-axis orientation closest to the first electrode 1.

It will be noted that the C-axis orientation of the electron transport sub-layer may be tested by the following method: XRD test is performed on the electron transport sub-layer, the film thickness of the film selects about 50 nm, and the grazing angle is within 1° to 2°. For example, in the XRD test results of the electron transport sub-layer with the C-axis orientation, a baseline signal of the film is within 500 a.u. to 1500 a.u., and the signal intensity of the (002) crystal plane exceeds 500 a.u than the baseline, which is considered to have a C-axis orientation. In the film layer with the C-axis orientation, the signal intensity of the (002) crystal plane exceeding 500 a.u. to 5000 a.u. than the baseline is a relatively common range. The more it exceeds, the stronger the diffraction signal of the (002) crystal plane, which indicates that the degree of the C-axis orientation of the electron transport sub-layer with the C-axis orientation, and the electron transport sub-layer with the C-axis orientation has the obvious crystallinity in the vertical direction. It may be seen through the above test that the signal intensity of the (002) crystal plane of the electron transport sub-layer with the C-axis orientation on the side proximate to the light-emitting layer 3 exceeds the baseline more than the signal intensity of the (002) crystal plane of the electron transport sub-layer with the C-axis orientation on the side closest to the first electrode 1. That is to say, the greater the degree of the C-axis orientation of the electron transport sub-layer with the C-axis orientation proximate to the light-emitting layer 3, the better the verticality of the crystal grains, and the greater the ratio of the electric conductivity of the electron transport sub-layer in the direction perpendicular to the plane where the light-emitting layer 3 is located to the electric conductivity of the electron transport sub-layer in the direction parallel to the plane where the light-emitting layer 3 is located. Therefore, compared with the electron transport sub-layer with the C-axis orientation closest to the first electrode 1, the electron transport sub-layer with the C-axis orientation closest to the light-emitting layer 3 has a more obvious suppression effect on the side electric leakage phenomenon of the light-emitting device 10, which is beneficial to the carrier balance of the light-emitting device 10, thereby improving the efficiency of the light-emitting device 10.

In some embodiments, the same atoms included in a material of each electron transport sub-layer 21 are oxygen atoms and zinc atoms.

For example, referring to FIGS. 4A, 5A and 6A, in a case where the electron transport layer 2 has a single layer, two layers or three layers, the material of each electron transport sub-layer 21 include the same atoms, that is, oxygen atoms and zinc atoms. For example, the material of each electron transport sub-layer 21 is zinc oxide (ZnO), or zinc oxide doped with other atoms such as magnesium (Mg) or gallium (Ga).

Figure 7:
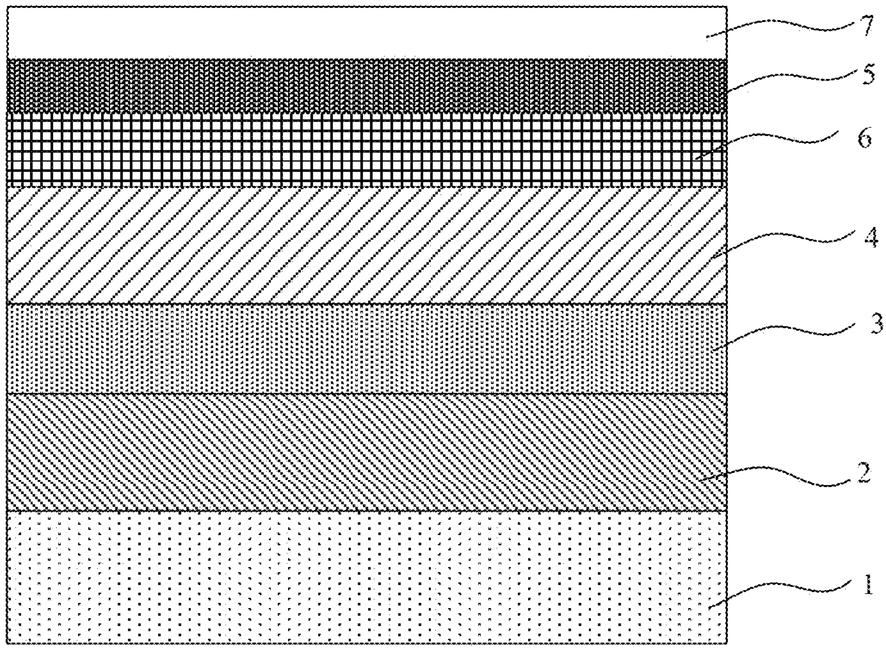
FIG. 7 is a diagram showing an inverted structure of yet another light-emitting device, in accordance with some embodiments of the present disclosure.

It will be noted that FIGS. 8A to 12 are simulation tests of the current density and the current efficiency of the light-emitting device conducted by the inventor of the present disclosure. The structure of the light-emitting device on which the above-mentioned simulation test is based and the materials, thicknesses, and manufacturing processes of film layers except the electron transport layer are as follows. As shown in FIG. 7, the light-emitting device includes a first electrode 1, an electron transport layer 2, a light-emitting layer 3, a hole transport layer 4, a hole injection layer 6, a second electrode 5 and a cover layer 7 that are stacked in sequence. The first electrode 1 is formed by depositing opaque silver with a thickness in a range of 80 nm to 100 nm and then depositing indium tin oxide (ITO) with a thickness in a range of 8 nm to 10 nm on the top of the silver. The light-emitting layer 3 is formed by depositing cadmium selenide (CdSe) with a thickness in a range of 15 nm to 30 nm. The hole transport layer 4 is formed by depositing two layers of hole transport materials, a hole transport material proximate to the light-emitting layer is molybdenum oxide ($MoO_x$) with a thickness in a range of 5 nm to 10 nm, and a hole transport material away from the light-emitting layer 3 is nickel oxide ($NiO_x$) with a thickness in a range of 20 nm to 30 nm. The hole injection layer 6 is formed by depositing the molybdenum oxide ($MoO_x$) material with a thickness in a range of 5 nm to 10 nm. The second electrode 5 is formed by depositing the silver material with a thickness of 10 nm. The cover layer 7 provided on the second electrode 5 is made of an organic material with a thickness of 70 nm. The inverted light-emitting device is illustrated as an example. The material, thickness, and manufacturing process of the electron transport layer are variables in each simulation test. That is, in each simulation test, other film layers except the electron transport layer satisfy the above-mentioned settings. As shown in FIGS. 8A to 12, the ZnO marked in the figures indicates that the material of the electron transport sub-layer is ZnO, c-ZnO indicates that the material of the electron transport sub-layer is ZnO, and the electron transport sub-layer has a C-axis orientation, and ZMO indicates that the material of the electron transport sub-layer is Mg-doped ZnO (also called magnesium zinc oxide (ZnMgO)). ZMO/c-ZnO indicates that the two electron transport sub-layers are a magnesium zinc oxide film layer and a zinc oxide film layer with a C-axis orientation that are arranged in sequence on a side of the first electrode, and c-ZnO/ZMO/c-ZnO indicates that the three electron transport sub-layers are a zinc oxide film layer with a C-axis orientation, a magnesium zinc oxide film layer, and a zinc oxide film layer with a C-axis orientation that are arranged in sequence on a side of the first electrode, that is, the magnesium zinc oxide film layer is inserted between two zinc oxide film layers.

The relationship between the thickness of the electron transport sub-layer in the light-emitting device and the current efficiency will be introduced below.

In some embodiments, in the three electron transport sub-layers 21, a ratio of a thickness of an electron transport sub-layer 21 in the middle to a total thickness of the electron transport layer 2 is in a range of 0.23 to 0.35, inclusive.

In some examples, as shown in FIGS. 6A and 6B, the electron transport layers 2 of the light-emitting devices in FIGS. 6A and 6B both include three electron transport sub-layers. The ratio of the thickness of the electron transport sub-layer 21 in the middle to the total thickness of the electron transport layer 2 is in the range of 0.23 to 0.35, inclusive. For example, the thickness of the electron transport sub-layer 21 in the middle is 10 nm, and then the total thickness of the electron transport layer 2 is 30 nm. The thickness of the electron transport sub-layer 21 in the middle is 20 nm, and then the total thickness of the electron transport layer 2 is 60 nm. The thickness of the electron transport sub-layer 21 in the middle is 30 nm, and then the total thickness of the electron transport layer 2 is 90 nm. Here, a total thickness of two electron transport sub-layers adjacent to the electron transport sub-layer 21 in the middle is not limited.

Figure 11:
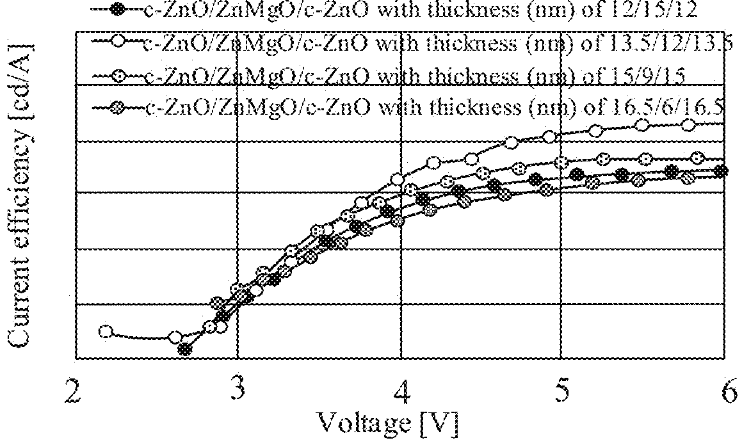
FIG. 11 is yet another curve graph of a current efficiency changing with a voltage, in accordance with some embodiments of the present disclosure.
Figure 12:
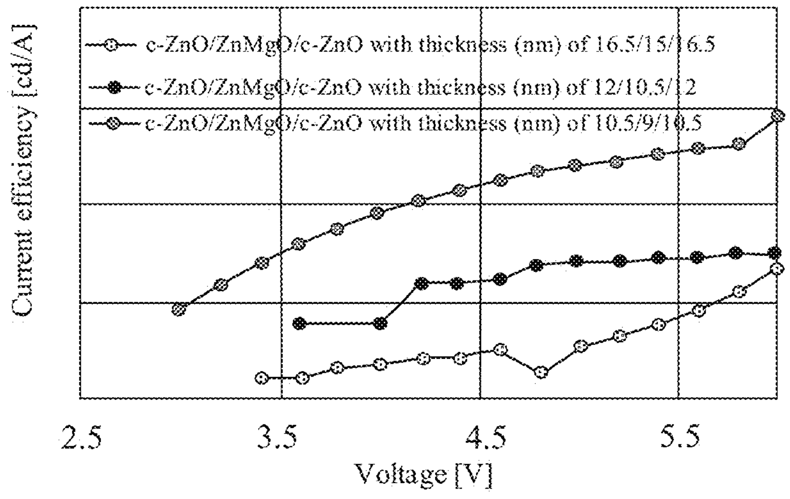
FIG. 12 is yet another curve graph of a current efficiency changing with a voltage, in accordance with some embodiments of the present disclosure.

In the following, in a case where the electron transport layer 2 of the light-emitting device includes three electron transport sub-layers, simulation experiments are performed on the light-emitting devices, in which three electron transport sub-layers of any light-emitting device have different thicknesses from three electron transport sub-layers of another light-emitting device. As shown in FIGS. 11 and 12, c-ZnO/ZMO/c-ZnO indicates that the three electron transport sub-layers are the zinc oxide film layer with the C-axis orientation, the magnesium zinc oxide film layer, and the zinc oxide film layer with the C-axis orientation, which are arranged in sequence on the side of the first electrode. That is, the magnesium zinc oxide film layer is inserted between two zinc oxide film layers. FIG. 11 shows a changing law of a current efficiency of the corresponding electron transport layer with a voltage in a case where the electron transport layer includes three electron transport sub-layers, and the total thickness of the electron transport layer is constant, which is 39 nm. It can be seen from the figure that in a case where the thicknesses of the three electron transport sub-layers are 13.5 nm, 12 nm and 13.5 nm, respectively, the corresponding light-emitting device 10 has the highest efficiency, and in this case, the ratio of the thickness of the electron transport sub-layer 21 in the middle to the total thickness of the electron transport layer 2 is 0.31; and in a case where the thicknesses of the three electron transport sub-layers are 12 nm. 15 nm and 12 nm, respectively, the corresponding light-emitting device 10 has a relatively good efficiency, and in this case, the ratio of the thickness of the electron transport sub-layer 21 in the middle to the total thickness of the electron transport layer 2 is 0.23. It can thus be concluded that in a case where the electron transport layer includes three electron transport sub-layers, the ratio of the thickness of the electron transport sub-layer 21 in the middle to the total thickness of the electron transport layer 2 is in the range of 0.23 to 0.35, and the current density is low. Therefore, the crosstalk of electrical signals may be effectively reduced, and the efficiency of the light-emitting device 10 may be improved, so that the service life of the light-emitting device 10 may be rather long. FIG. 12 shows a changing law of a current efficiency of the corresponding electron transport layer with a voltage in a case where the electron transport layer includes three electron transport sub-layers, the total thickness of the electron transport layer changes and the thickness difference between the three electron transport sub-layers remains the same. It can be seen from the figure that the smaller the total thickness of the electron transport layer, the higher the current efficiency of the light-emitting device 10, and the longer the service life of the light-emitting device 10.

The change in structure and characteristic generated due to an oxygen supplementation operation on the electron transport sub-layer are introduced below.

In some embodiments, the electron transport layer 2 includes at least two electron transport sub-layers 21, and an oxygen vacancy proportion of the electron transport sub-layer 21 closest to the light-emitting layer 3 is lower than an oxygen vacancy proportion of one of remaining electron transport sub-layer(s) 21.

It will be noted that, as shown in FIGS. 5A and 5B, the electron transport layer 2 includes two electron transport sub-layers 21. The oxygen vacancy proportion of the electron transport sub-layer 21 (the second electron transport sub-layer 210) on the side closest to the light-emitting layer 3 is lower than the oxygen vacancy proportion of another electron transport sub-layer (the first electron transport sub-layer 211). Alternatively, as shown in FIG. 6A, the electron transport layer 2 includes three electron transport sub-layers 21. The oxygen vacancy proportion of the electron transport sub-layer 21 (the second electron transport sub-layer 210) on the side closest to the light-emitting layer 3 is lower than the oxygen vacancy proportion of any of remaining electron transport sub-layers (the first electron transport sub-layer 211 and the intermediate electron transport sub-layer 212).

Oxygen vacancy (OV) is a type of metal oxide defect, and the oxygen vacancy is formed by the lack of oxygen caused by a detachment of oxygen in the lattice of the metal oxide under specific external environment (e.g., high temperature, reduction treatment). For example, oxygen vacancies in the zinc oxide film refer to vacancies formed in the zinc oxide lattice due to the detachment of oxygen. The low oxygen vacancy proportion of the electron transport sub-layer indicates that zinc oxide has a rather small defect due to less detachment of oxygen in the zinc oxide lattice. Here, the reduction of the oxygen vacancy proportion is realized by supplementing oxygen in a process of forming the electron transport sub-layer 21, so that the oxygen vacancies in the zinc oxide lattice are filled with oxygen atoms. According to the (X-ray photoelectron spectroscopy) XPS test, the electron transport sub-layer 21 formed after the oxygen supplementation in the process has a lower oxygen vacancy proportion than an electron transport sub-layer formed without the oxygen supplementation. The oxygen vacancy proportion of the second electron transport sub-layer 210 is reduced, and thus the electric conductivity of the second electron transport sub-layer 210 may be weakened. The reduction of electron injection is beneficial to the carrier balance of the light-emitting device, thereby improving the luminous efficiency. The following will corroborate the above effect through the simulation test of the light-emitting device.

Figure 8A:
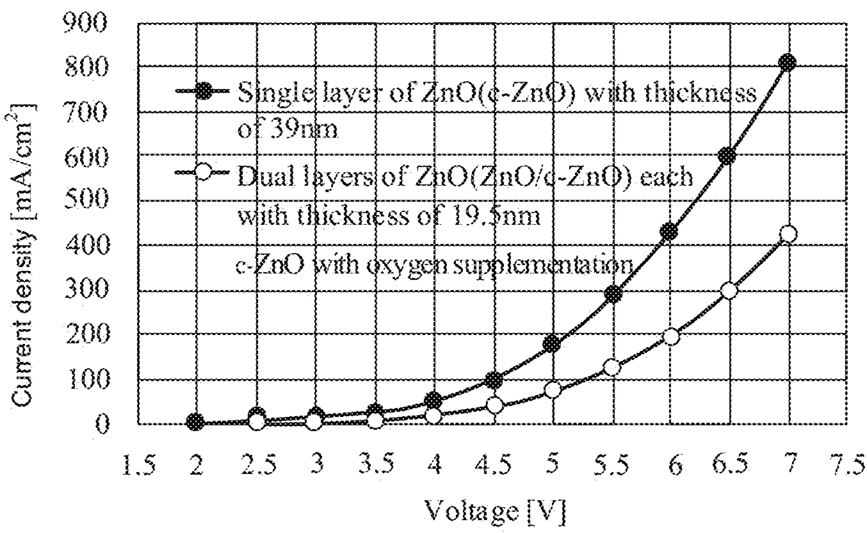
FIG. 8A is a curve graph of a current density changing with a voltage, in accordance with some embodiments of the present disclosure.
Figure 8B:
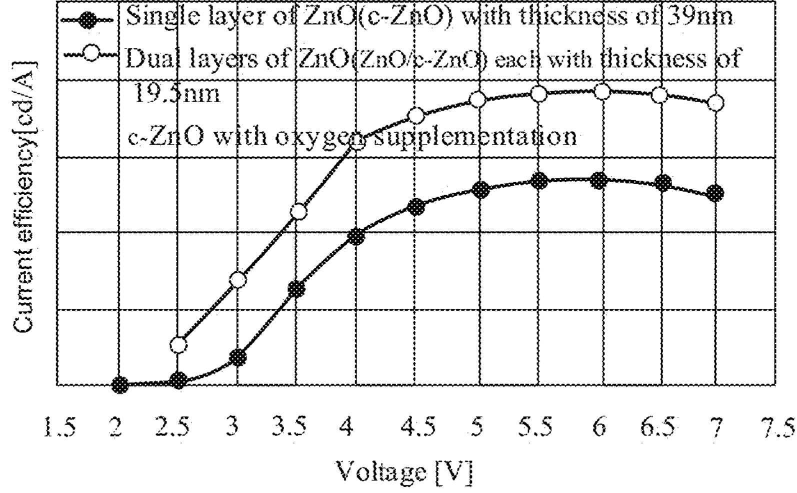
FIG. 8B is a curve graph of a current efficiency changing with a voltage, in accordance with some embodiments of the present disclosure.

As shown in FIGS. 8A and 8B, the current densities and the current efficiencies of two light-emitting devices are tested. An electron transport layer of a light-emitting device includes a single-layer zinc oxide film, and the zinc oxide film has a thickness of 39 nm and is formed by a magnetron sputtering process. An electron transport layer of another light-emitting device includes two electron transport sub-layers, which are each a zinc oxide film with a thickness of 19.5 nm and each formed by a magnetron sputtering process. In the process of forming a second layer of electron transport sub-layer, 10% oxygen is introduced, the second layer of electron transport sub-layer refers to an electron transport sub-layer proximate to the light-emitting layer, and the second layer of electron transport sub-layer is an electron transport sub-layer with a C-axis orientation. It can be seen from FIG. 8A that, compared with the single-layer zinc oxide film, after the oxygen supplementation of the second layer of electron transport sub-layer, the current density decreases, which indicates that the electric conductivity of the second layer of electron transport sub-layer 21 is weakened, thereby reducing the electron injection. Referring to FIG. 8B, compared with the single-layer zinc oxide film, after the oxygen supplementation of the second layer of electron transport sub-layer, the carrier balance of the light-emitting device 10 may be improved, and the light-emitting device 10 may have a higher efficiency.

In some examples, each electron transport sub-layer in the electron transport layer may be supplemented with oxygen, so that the electric conductivity of each electron transport sub-layer is weakened, thereby reducing electron injection. Therefore, the carrier balance of the light-emitting device may be rather stable, so as to get a rather good luminous efficiency.

In some embodiments, the amount of supplemented oxygen during manufacturing the electron transport sub-layer 21 on the side closest to the light-emitting layer 3 is in a range of 0 to 10%. For example, the amount of supplemented oxygen is 8%.

Figure 8C:
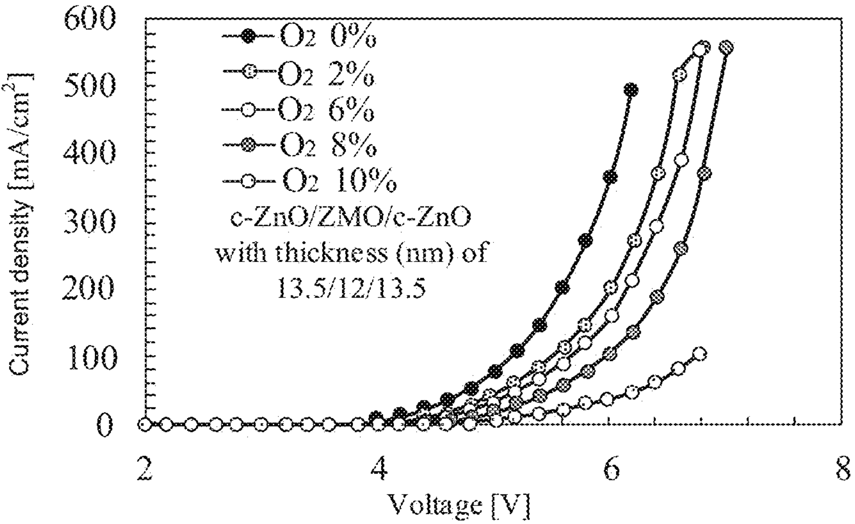
FIG. 8C is a curve graph of a current density changing with a voltage, in accordance with some embodiments of the present disclosure.
Figure 8D:
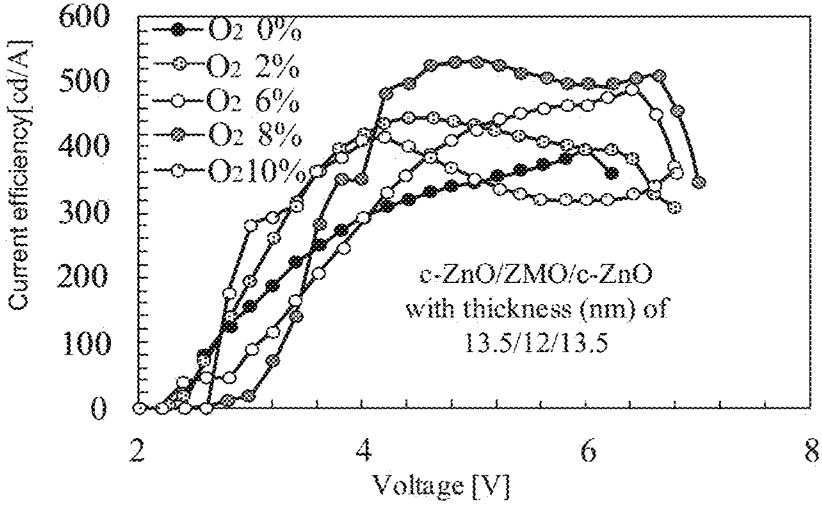
FIG. 8D is a curve graph of a current efficiency changing with a voltage, in accordance with some embodiments of the present disclosure.

As shown in FIGS. 8C and 8D, the current densities and the current efficiencies of five light-emitting devices are tested. The electron transport layers of the five light-emitting devices each include three electron transport sub-layers, and in the three electron transport sub-layers, a first electron transport sub-layer 211 and a second electron transport sub-layer 210 are both zinc oxide films with the C-axis-orientation, and an intermediate electron transport sub-layer 212 is a magnesium zinc oxide film. The first electron transport sub-layer 211, the intermediate electron transport sub-layer 212 and the second electron transport sub-layer 210 have thicknesses of 13.5 nm, 12 nm and 13.5 nm, respectively, and are all formed by magnetron sputtering processes. In a process of forming second electron transport sub-layers 210, different oxygen contents are introduced. It can be seen from FIG. 8C that in a case where the amount of supplemented oxygen changes from 0% to 10%, the current density of the light-emitting device 10 decreases, which indicates that the electric conductivity of the second electron transport sub-layer 210 is weakened, thereby reducing the electron injection. Referring to FIG. 8D, after the oxygen supplementation of the second electron transport sub-layer, in a case where the amount of oxygen supplement is 8%, the carrier balance of the light-emitting device 10 may have an optimal effect, and the light-emitting device 10 may have a highest efficiency.

In some embodiments, the oxygen vacancy proportion of the electron transport sub-layer 21 closest to the light-emitting layer 3 is lower by 5% to 25% than the oxygen vacancy proportion of any of the remaining electron transport sub-layer(s) 21.

It will be noted that the electron transport sub-layer 21 on the side closest to the light-emitting layer 3 has a rather low oxygen vacancy proportion, which means that the electron transport sub-layer 21 on the side closest to the light-emitting layer 3 has a high oxygen content. Therefore, the electric conductivity of the electron transport sub-layer 21 may be reduced, and the electron injection may be reduced, which is beneficial to the carrier balance of the light-emitting device 10, thereby improving the efficiency of the light-emitting device 10.

In some embodiments, a lowest unoccupied molecular orbital (LUMO) energy level of the electron transport sub-layer (the second electron transport sub-layer 210) on the side closest to the light-emitting layer is closer to a LUMO energy level of the light-emitting layer than a LUMO energy level of any of the remaining electron transport sub-layer(s).

It will be noted that the LUMO (Lowest Unoccupied Molecular Orbital) energy level represents an orbital energy level with the lowest energy level without electrons occupied. For example, by supplementing oxygen in a process of forming the second electron transport sub-layer 210, the energy level difference between the second electron transport sub-layer 210 and the light-emitting layer 3 is adjusted, so that the LUMO energy level of the second electron transport sub-layer 210 is closer to the LUMO energy level of the light-emitting layer. In this way, the carrier mobility may be enhanced, thereby reducing the working voltage of the light-emitting device 10 and prolonging the life of the light-emitting device 10. Moreover, the introduction of oxygen causes the change of the LUMO energy level of the second electron transport sub-layer 210, which is beneficial to balancing the increase in the device voltage due to the decrease in the electric conductivity of the electron transport layer 2, thereby improving the efficiency of the light-emitting device 10.

The change in structure and characteristic generated due to a doping operation on the electron transport sub-layer are introduced below.

In some embodiments, the electron transport layer 2 includes three electron transport sub-layers 21, and the electron transport sub-layer 21 in the middle includes dopant atoms. The dopant atoms include at least one of magnesium, gallium, and boron nitride.

For example, as shown in FIG. 6A, the electron transport layer 2 includes three electron transport sub-layers 21, and the electron transport sub-layer 21 (the intermediate electron transport sub-layer 212) in the middle is an electron transport sub-layer with a non-C-axis orientation. The intermediate electron transport sub-layer 212 further includes dopant atoms in addition to oxygen atoms and zinc atoms, and the dopant atoms include at least one of magnesium (Mg) and gallium (Ga). That is to say, the electron transport sub-layer with the non-C-axis orientation is a magnesium-doped zinc oxide (ZnO) film layer or a gallium-doped zinc oxide (ZnO) film layer, or a magnesium zinc oxide (ZnMgO) film layer or a film layer containing boron nitride. The doping performed on the intermediate electron transport sub-layer 212 may weaken the electric conductivity of the second electron transport sub-layer 210 and reduce electron injection, which is beneficial to the carrier balance of the light-emitting device, thereby improving the efficiency. The following will corroborate the above effect through the simulation test of the light-emitting device.

Figure 9A:
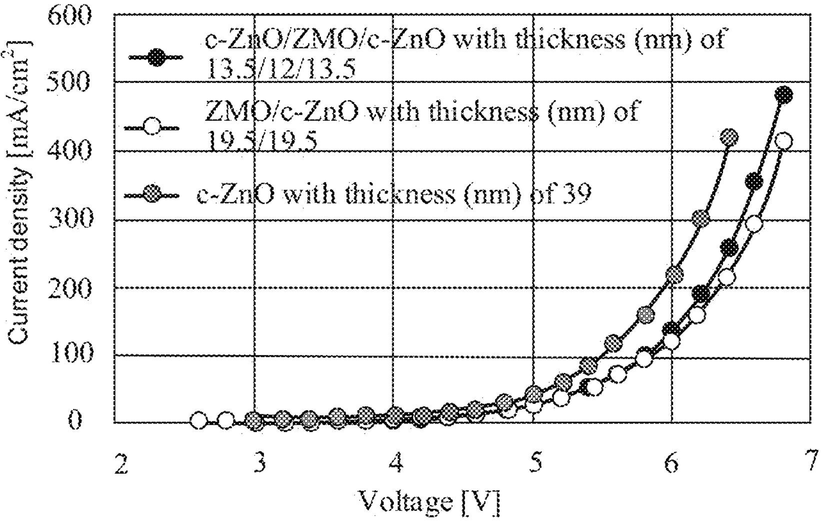
FIG. 9A is another curve graph of a current density changing with a voltage, in accordance with some embodiments of the present disclosure.
Figure 9B:
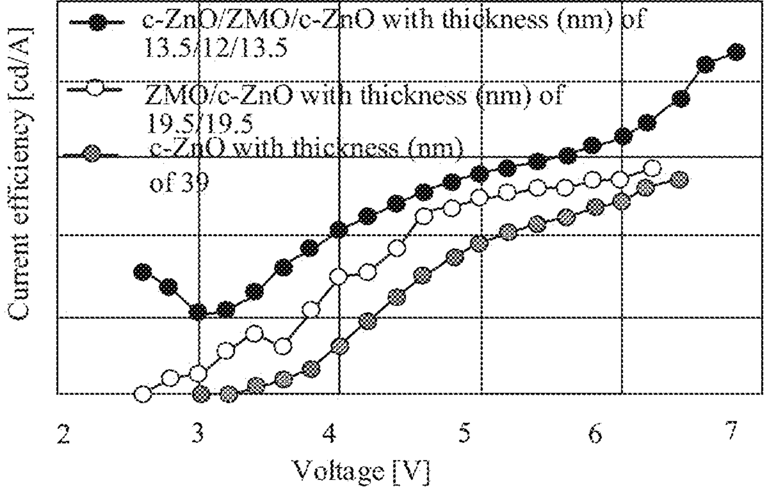
FIG. 9B is another curve graph of a current efficiency changing with a voltage, in accordance with some embodiments of the present disclosure.

Referring to FIGS. 9A and 9B, FIG. 9A is a curve graph of a current density changing with a voltage, and FIG. 9B is a curve graph of a current efficiency changing with a voltage. In combination with FIGS. 9A and 9B, the current densities and the current efficiencies of three light-emitting devices are tested. An electron transport layer of a first light-emitting device includes a single-layer zinc oxide film with the C-axis orientation with a thickness of 39 nm. An electron transport layer of a second light-emitting device includes two electron transport sub-layers, which are a magnesium zinc oxide film layer and a zinc oxide film layer with the C-axis orientation, and each of which has a thickness of 19.5 nm. An electron transport layer of a third light-emitting device includes three electron transport sub-layers, which are a zinc oxide film layer with the C-axis orientation, a magnesium zinc oxide film layer and a zinc oxide film layer with the C-axis orientation (i.e., the magnesium zinc oxide film layer is inserted between two zinc oxide film layers), and the thicknesses of the three film layers are 13.5 nm, 12 nm, and 13.5 nm. It can be seen from FIG. 9A that, compared with the single-layer zinc oxide film with the C-axis orientation, the light-emitting devices provided with the magnesium zinc oxide film layers have lower current densities, thereby weakening the electric conductivity of the electron transport layers and reducing electron injection. Referring to FIG. 9B, in a case where the electron transport layer of the light-emitting device 10 is the two zinc oxide film layers and the magnesium zinc oxide film layer inserted therebetween, the light-emitting device 10 may have a better effect of carrier balance and a higher current efficiency, which indicates that adding dopant atoms (e.g., magnesium) in the intermediate electron transport sub-layer may improve the current efficiency of the light-emitting device.

Figure 10A:
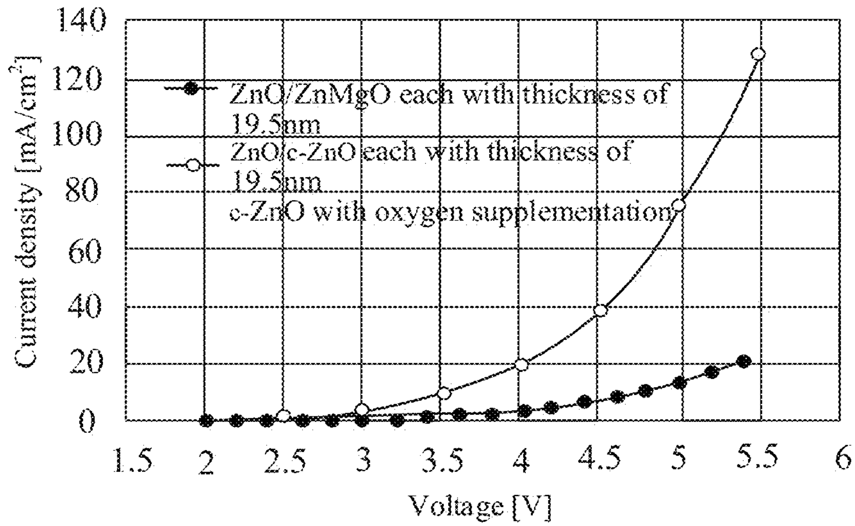
FIG. 10A is yet another curve graph of a current density changing with a voltage, in accordance with some embodiments of the present disclosure.
Figure 10B:
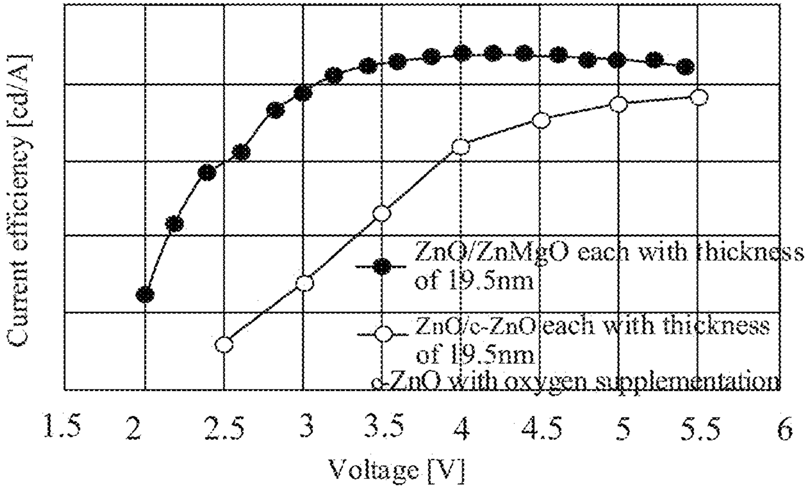
FIG. 10B is yet another curve graph of a current efficiency changing with a voltage, in accordance with some embodiments of the present disclosure.

In some examples, as shown in FIGS. 10A and 10B, the current densities and the current efficiencies of two light-emitting devices are tested. An electron transport layer of a light-emitting device includes a magnesium zinc oxide film layer and a zinc oxide film, and the two films each have a thickness of 19.5 nm and are formed by sputtering processes. An electron transport layer of another light-emitting device includes two electron transport sub-layers which are both zinc oxide films, and the two films each have a thickness of 19.5 nm and are formed by sputtering processes. In the process of forming a second layer of electron transport sub-layer, 10% oxygen is introduced. The second layer of electron transport sub-layer refers to an electron transport sub-layer proximate to the light-emitting layer. It can be seen from FIG. 10A that compared with the two layers of zinc oxide films, the light-emitting device provided with the magnesium zinc oxide film has a lower current density, and the electric conductivity of the electron transport sub-layer 21 may be weakened, thereby reducing the electron injection. Referring to FIG. 10B, compared with the two layers of zinc oxide films, the light-emitting device provided with the magnesium zinc oxide film has a better effect of carrier balance and a higher current efficiency of the light-emitting device 10, which indicates that compared with the oxygen supplementation in the electron transport sub-layer, adding doped atoms in the electron transport sub-layer has a better effect on improving the efficiency of the light-emitting device.

In some embodiments, a conduction band energy level of an electron transport sub-layer 21 containing dopant atoms is shallower than a conduction band energy level of an electron transport sub-layer 21 not containing dopant atoms. For example, the conduction band energy level of the zinc oxide film layer doped with magnesium is shallower than the conduction band energy level of the zinc oxide film layer.

Through the above settings, adding dopant atoms in the electron transport sub-layer 21 may reduce the conduction band energy level of this layer, so that a plurality of electron transport sub-layers that are stacked have inconsistent conduction band energy levels, and the generated difference of conduction band energy level may change electron transmission efficiency, which is beneficial to adjust the balance of carrier injection of the light-emitting device 10. As a result, the working voltage of the light-emitting device 10 may be reduced and the service life of the light-emitting device 10 may be prolonged.

In some embodiments, the material of the electron transport layer 2 is at least one of inorganic materials, and each electron transport sub-layer 21 in the electron transport layer 2 is not provided with a ligand material.

For example, a proportion of the organic material in the electron transport sub-layer 21 is smaller than a proportion of the organic material in the hole transport layer, the light-emitting layer or the hole injection layer. The material of the electron transport layer 2 is the inorganic material, and the proportion of the organic material in the electron transport sub-layer 21 is 0.

Figure 13:
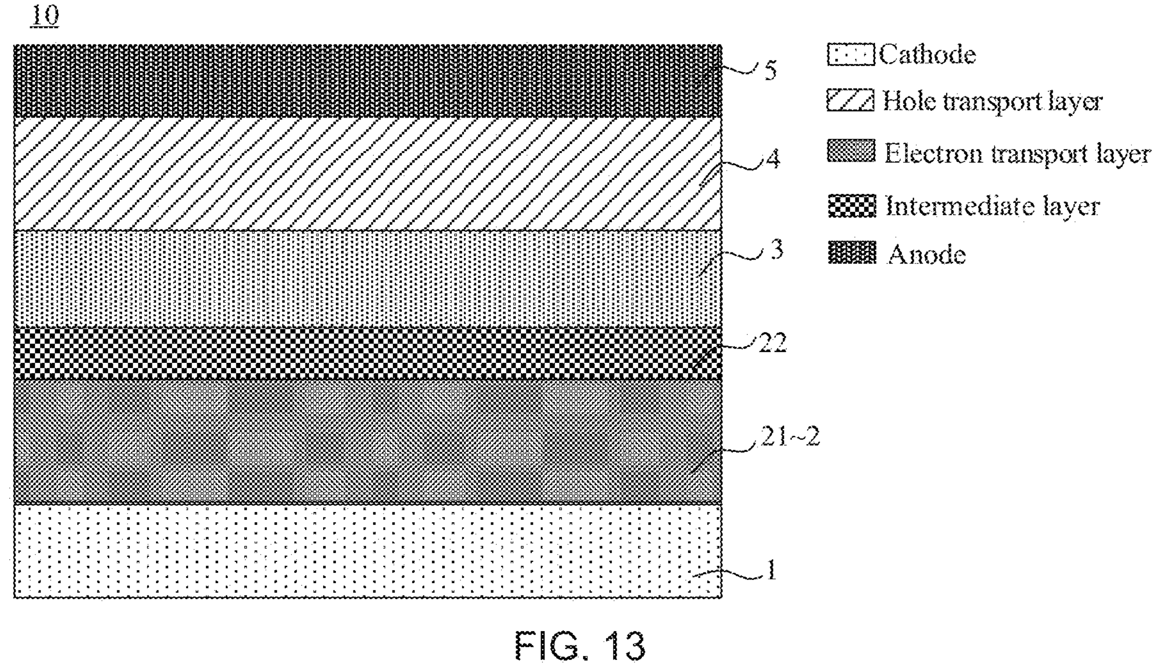
FIG. 13 is a diagram showing a structure of a light-emitting device, in accordance with some embodiments of the present disclosure.

In some embodiments, as shown in FIG. 13, an intermediate layer 22 is provided between the light-emitting layer 3 and the electron transport sub-layer 21 on the side closest to the light-emitting layer 3, and the material of the intermediate layer 22 is an organic matter or a polymer. The material of the intermediate layer 22 fills pores between adjacent crystal grains of the electron transport sub-layer 21 on the side closest to the light-emitting layer 3.

For example, the material of the intermediate layer 22 is an organic matter or a polymer, such as polyethylenimine ethoxylated (PEIE), polymethyl methacrylate (PMMA) or other polymers, or an alkylamine, an aromatic amine or other organic matters. The electron transport sub-layer 21 on the side closest to the light-emitting layer 3 is an electron transport sub-layer with a C-axis orientation. There are gaps between the plurality of crystal grains included in the electron transport sub-layer with the C-axis orientation, and the material of the intermediate layer fills the pores between adjacent crystal grains of the electron transport sub-layer 21 on the side closest to the light-emitting layer 3, and thus the side electric leakage may be further suppressed. Moreover, it is beneficial to the carrier balance of the light-emitting device 10, thereby improving the current efficiency of the light-emitting device 10.

For example, the thickness of the intermediate layer 22 is smaller than the thickness of the electron transport sub-layer 21 on the side closest to the light-emitting layer 3, and the thickness of the intermediate layer 22 is smaller than the thickness of the light-emitting layer 3.

In some embodiments, the light-emitting device 10 has an inverted structure, and a side of each electron transport sub-layer 21 in the electron transport layer 2 away from the first electrode 1 has a surface roughness in a range of 0.5 nm to 2 nm.

In some examples, the electron transport layer 2 is formed by a magnetron sputtering process and has a surface roughness. Referring to FIGS. 4A, 5A and 6A, a surface roughness (RMS, root mean square of roughness) of a surface of each electron transport sub-layer 21 in the electron transport layer 2 away from the first electrode 1 is in a range of 0.5 nm to 2.0 nm, inclusive. For example, each electron transport sub-layer 21 in the electron transport layer 2 is formed by a magnetron sputtering process, and the surface roughness thereof is 0.5 nm, 0.7 nm or 2.0 nm. Therefore, the flatness of the surface is good, which satisfies requirements for the flat surface of the film layer.

In some embodiments, the light-emitting device has an upright structure, and a side of each electron transport sub-layer 21 in the electron transport layer 2 away from the second electrode 5 has a surface roughness in a range of 0.5 nm to 2 nm.

In some examples, the electron transport layer is formed by a magnetron sputtering process and has a surface roughness. Referring to FIGS. 4B, 5B and 6B, a surface roughness (RMS, root mean square of roughness) of a surface of each electron transport sub-layer 21 in the electron transport layer 2 away from the second electrode 5 is in a range of 0.5 nm to 2.0 nm, inclusive. For example, each electron transport sub-layer 21 in the electron transport layer 2 is formed by a magnetron sputtering process, and the surface roughness thereof is 0.5 nm, 0.7 nm or 2.0 nm. Therefore, the flatness of the surface is good, which satisfies requirements for the flat surface of the film layer.

In some embodiments, the first electrode 1 is an opaque metal electrode of aluminum, silver, titanium or molybdenum (the thickness of the metal electrode is in a range of 60 nm to 150 nm), and indium tin oxide (ITO), fluorine-doped tin oxide (FTO), or conductive polymer deposited thereon (the thickness of the conductive polymer is in a range of 5 nm to 50 nm).

In some embodiments, the light-emitting layer 3 is a quantum dot light-emitting layer, and the quantum dot light-emitting layer emits one of three colors of red, green and blue.

For example, the quantum dots may be a cadmium-contained material such as cadmium selenide (CdSe), or a cadmium-free material such as indium phosphide (InP).

In some embodiments, the hole transport layer 4 includes at least one hole transport material, and the hole transport material includes at least one of an organic transport material and an inorganic oxide transport material.

For example, the organic transport material mainly includes polyvinylcarbazole, 1,2,4,5-tetrakis(trifluoromethyl)benzene, N,N'-bis(3-methylphenyl)-N,N'-diphenyl-[1,1'-Biphenyl]-4,4'-diamine, or the like.

For example, the inorganic oxide transport material mainly includes nickel oxide, vanadium oxide, and the like, which may improve the energy conversion efficiency and electric conductivity of the hole transport layer.

For example, the thickness of the hole transport layer is in a range of 10 nm to 40 nm, preferably 25 nm to 35 nm.

In some embodiments, the second electrode 5 is a transparent and conductive indium tin oxide (ITO) or indium zinc oxide (IZO) electrode, a semiconductor electrode (e.g., FTO glass electrode) or a conductive polymer, and the thickness of the second electrode 5 may be in a range of 40 nm to 200 nm.

For example, the second electrode 5 is a metal electrode such as aluminum or silver, and the thickness of the metal electrode is in a range of 10 nm to 20 nm.

Figure 14A:
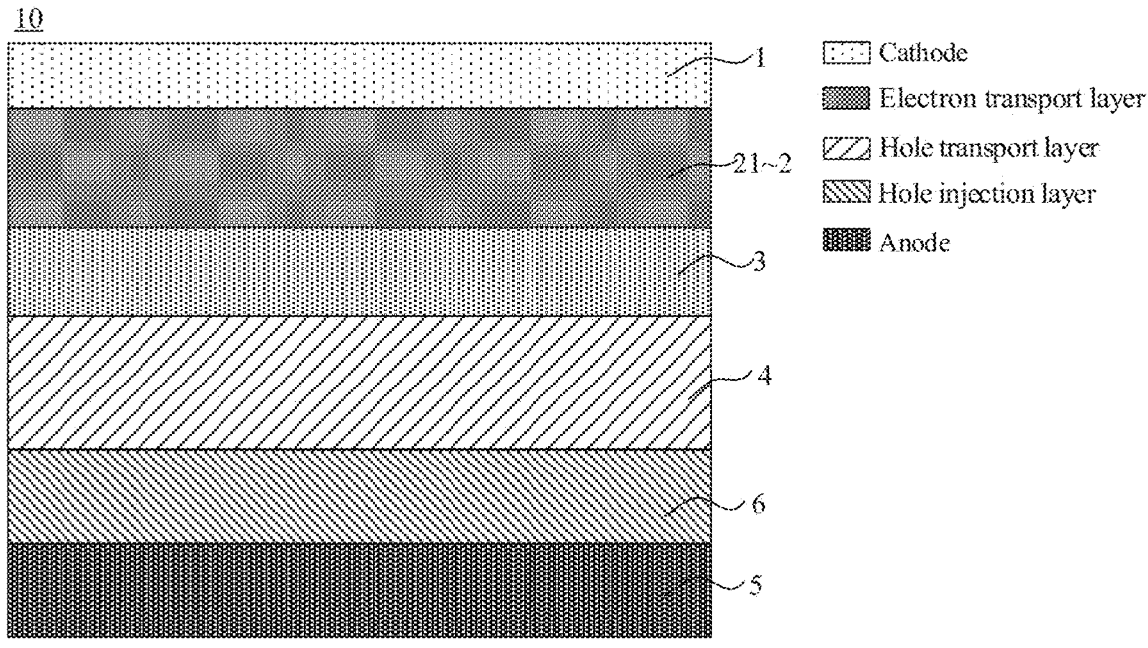
FIG. 14A is a diagram showing a structure of another light-emitting device, in accordance with some embodiments of the present disclosure.
Figure 14B:
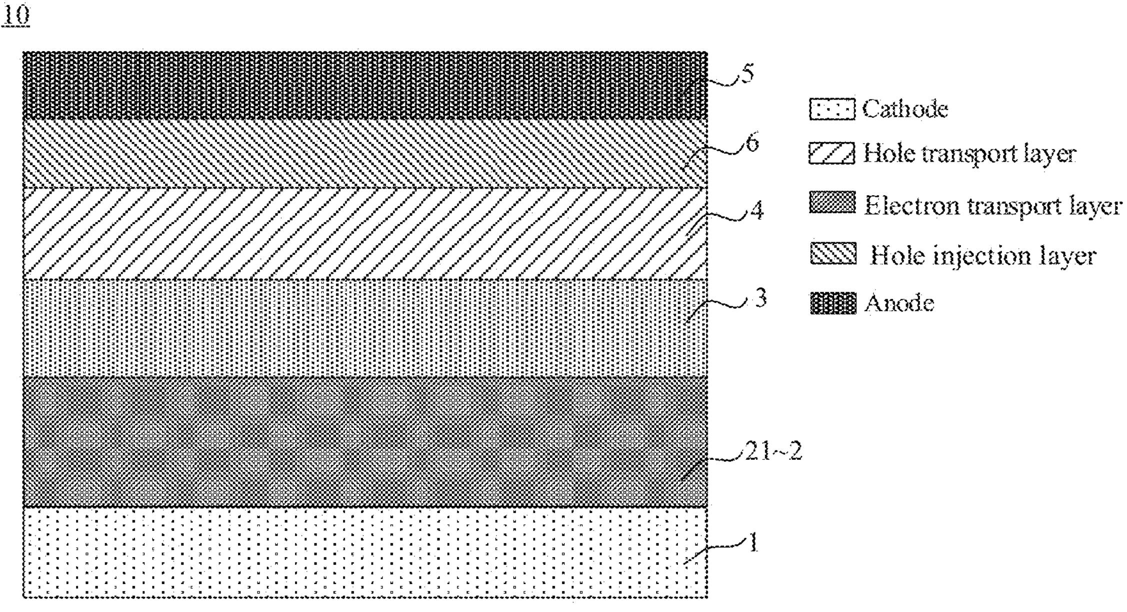
FIG. 14B is a diagram showing a structure of yet another light-emitting device, in accordance with some embodiments of the present disclosure.

In some embodiments, as shown in FIGS. 14A and 14B, the light-emitting device 10 further includes a hole injection layer 6 disposed on a side of the hole transport layer 4 away from the light-emitting layer 3.

For example, the material of the hole injection layer 6 includes a polymer aqueous solution (poly (3,4-ethylenedioxythiophene)-poly (styrenesulfonate), PEDOT:PSS), or 2,3,6,7,10,11-hexacyano-1,4,5,8,9,12-hexaazatriphenylene (HAT-CN), or may alternatively be an inorganic oxide such as molybdenum oxide ($MoO_x$), which has a strong electron-absorption ability.

In some embodiments, referring to FIG. 7, the light-emitting device 10 further includes a cover layer 7. The cover layer 7 is disposed on a side of the second electrode 5 away from the light-emitting layer 3, and the thickness of the cover layer 7 is in a range of 40 nm to 90 nm, inclusive.

For example, the thickness of the cover layer 7 is in the range of 40 nm to 90 nm, preferably 70 nm. The material of the cover layer 7 is an organic material with a relatively large refractive index and a small light absorption coefficient, which may improve the light extraction effect.

It will be noted that the light-emitting device 10 has an inverted structure, and the cover layer 7 is provided on a side of the second electrode 5 away from the light-emitting layer 3. In a case where the light-emitting device 10 has an upright structure, the cover layer 7 is provided on a side of the first electrode 1 away from the light-emitting layer 3.

Figure 15A:
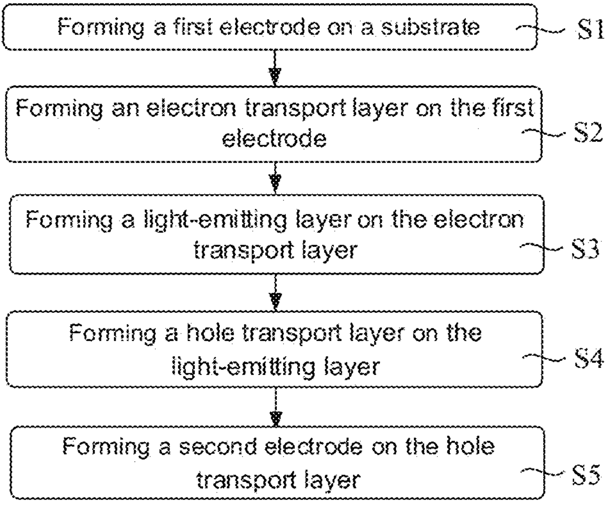
FIG. 15A is a flow diagram of a method for manufacturing a light-emitting device, in accordance with some embodiments of the present disclosure.

Some embodiments of the present disclosure further provide a method for manufacturing the light-emitting device 10. As shown in FIG. 15A, the method for manufacturing the light-emitting device 10 is introduced by considering an inverted light-emitting device 10 as an example, and the method includes steps 1 to 5 (S1 to S5).

In S1, a first electrode 1 is formed on a substrate.

For example, the substrate may be a glass or flexible polyethylene terephthalate (PET) substrate, and the first electrode 1 is a cathode.

For example, the first electrode 1 may be an opaque metal electrode of aluminum, silver, titanium, or molybdenum (the thickness of the metal electrode may be in a range of 60 nm to 150 nm), and indium tin oxide (ITO), fluorine-doped tin oxide (FTO), or the like deposited thereon.

For example, the first electrode 1 may be an opaque metal electrode of aluminum, silver, titanium, or molybdenum (the thickness of the metal electrode may be in a range of 60 nm to 150 nm), and a conductive polymer deposited thereon (the thickness of the conductive polymer is in a range of 5 nm to 50 nm).

For example, the first electrode 1 in the embodiments of the present disclosure is a metal electrode of opaque silver with a thickness of 80 nm, and indium tin oxide deposited thereon with a thickness of 10 nm.

In S2, an electron transport layer 2 is formed on the first electrode 1.

For example, as shown in FIGS. 4A, 5A and 6A, the formed electron transport layer 2 includes at least one electron transport sub-layer 21, and in the at least one electron transport sub-layer 21, an electron transport sub-layer 21 closest to a light-emitting layer 3 is an electron transport sub-layer with a C-axis orientation.

The C-axis orientation is a direction perpendicular to a plane where the light-emitting layer 3 is located. In the electron transport sub-layer 21 with the C-axis orientation, in a first direction X, a ratio of a number of crystal grains, each crystal grain of which has a distance from an adjacent crystal grain smaller than a size of the crystal grain itself, to the total number of crystal grains is greater than 50%, the first direction is parallel to the plane where the light-emitting layer is located; and in the direction perpendicular to the plane where the light-emitting layer 3 is located, a ratio of a number of crystal grains having no overlap with adjacent crystal grains to a total number of crystal grains is greater than 85%.

In S3, a light-emitting layer 3 is formed on the electron transport layer 2.

For example, the light-emitting layer 3 is a quantum dot light-emitting layer, and the quantum dot light-emitting layer is deposited by inkjet printing, photolithography, or the like. The quantum dot light-emitting layer may emit one of three colors of red, green and blue.

For example, the quantum dots may be a cadmium-contained material such as cadmium selenide (CdSe), or a cadmium-free material such as indium phosphide (InP).

For example, a thickness of the light-emitting layer 3 is in a range of 10 nm to 40 nm, preferably, 20 nm to 30 nm.

In S4, a hole transport layer 4 is formed on the light-emitting layer 3.

The hole transport layer 4 includes at least one hole transport material, and the hole transport material includes at least one of an organic transport material and an inorganic oxide transport material.

For example, the organic transport material mainly includes polyvinylcarbazole, 1,2,4,5-tetrakis(trifluoromethyl)benzene, N,N'-bis(3-methylphenyl)-N,N'-diphenyl-[1,1'-Biphenyl]-4,4'-diamine, or the like.

For example, the inorganic oxide transport material mainly includes nickel oxide, vanadium oxide, and the like, which may improve the energy conversion efficiency and electric conductivity of the hole transport layer.

For example, in the hole transport layer 4 in the embodiments of the present disclosure, a highest occupied molecular orbital (HOMO) energy level of a hole transport material proximate to the light-emitting layer 3 is in a range of −6.2 eV to −5.5 eV, and the material thereof may be molybdenum oxide ($MoO_x$), which is beneficial to the hole injection; and a HOMO energy level of a hole transport material away from the light-emitting layer is in a range of −5.3 eV to −5.0 eV, and the material thereof may be any of vanadium pentoxide ($V_2O_5$) and nickel oxide ($NiO_x$).

For example, the thickness of the hole transport layer is in a range of 10 nm to 40 nm, and in the embodiments of the present disclosure, it is preferably 25 nm to 35 nm.

In S5, a second electrode 5 is formed on the hole transport layer 4.

For example, the second electrode 5 is an anode, and may be a transparent and conductive indium tin oxide (ITO) or indium zinc oxide (IZO) electrode, a semiconductor electrode (e.g., FTO glass electrode) or a conductive polymer. The thickness of the second electrode 5 may be in a range of 40 nm to 200 nm.

For example, the second electrode 5 may alternatively be a metal electrode of aluminum or silver formed by vapor deposition, and the thickness of the metal electrode may be in a range of 10 nm to 20 nm.

In some examples, between S4 and S5, a step of forming a hole injection layer 6 on the hole transport layer 4 is further included. For example, the hole injection layer 6 is formed by a deposition process, and the thickness of the hole injection layer 6 is in a range of 3 nm to 7 nm, preferably 5 nm. The material of the hole injection layer 6 may be an organic material.

Figure 15B:
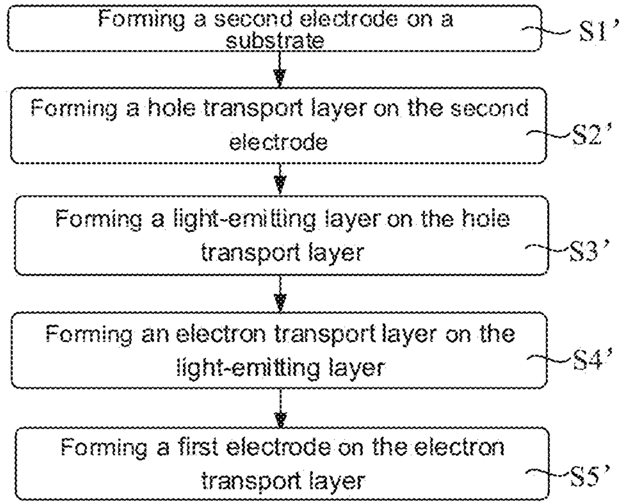
FIG. 15B is a flow diagram of another method for manufacturing a light-emitting device, in accordance with some embodiments of the present disclosure.

In some embodiments of the present disclosure, the light-emitting device 10 is upright. As shown in FIG. 15B, the method for manufacturing the upright light-emitting device includes steps 1' to 5' (S1' to S5').

In S1', a second electrode 5 is formed on the substrate.

In S2', a hole transport layer 4 is formed on the second electrode 5.

In S3', a light-emitting layer 3 is formed on the hole transport layer 4.

In S4', an electron transport layer 2 is formed on the light-emitting layer 3.

In S5', a first electrode 1 is formed on the electron transport layer 2.

In some examples, between S1' and S2', a step of forming a hole injection layer 6 on the second electrode 5 is further included. For example, the hole injection layer 6 is formed by a deposition process, and the thickness of the hole injection layer 6 is in a range of 3 nm to 7 nm, preferably 5 nm. The material of the hole injection layer 6 may be an organic material.

The specific manufacturing processes of S1' to S5' refer to introduction of corresponding steps in the above-mentioned method for manufacturing the inverted light-emitting device 10, which will not be repeated here. The following mainly introduces the formation process of the electron transport layer in S2 and S4'.

In some embodiments, the electron transport layer 2 is formed by depositing corresponding material(s) on a base by a magnetron sputtering process, and the degree of C-axis orientation of the formed electron transport sub-layer may be adjusted by controlling a temperature of the base in the deposition process or a power of magnetron sputtering. For example, in a case where the temperature of the base is 100° C., the formed electron transport layer hardly has a C-axis orientation, while in a case where the temperature of the base is an ordinary temperature or above 200° C., the formed electron transport layer has a rather obvious C-axis orientation. By increasing the sputtering power, the degree of C-axis orientation of the formed electron transport layer may also be reduced.

The light-emitting layer 3, the first electrode 1 or a formed electron transport sub-layer 21 is as the base for forming an electron transport sub-layer in the next step.

The method of forming the electron transport layer 2 in the inverted light-emitting device will be described in different situations below.

In a case where the formed electron transport layer 2 includes one electron transport sub-layer 21, S2 will be described. The single electron transport sub-layer 21 is an electron transport sub-layer 21 with a C-axis orientation.

As shown in FIG. 15A, forming the electron transport layer 2 on the first electrode 1 in step S2 includes: forming the electron transport sub-layer with the C-axis orientation on the first electrode by using a magnetron sputtering process.

In some embodiments, S2 includes a step 21-1 (S21-1).

In S21-1, a magnetron sputtering process is used to deposit a material of the electron transport sub-layer 21 on the first electrode 1 in a case where a temperature of the first electrode is a first temperature, so as to form an electron transport sub-layer with a C-axis orientation.

The first temperature is a temperature of the base that enables the material to have the C-axis orientation, for example, the first temperature is an ordinary temperature, i.e., 25° C.

For example, as shown in FIG. 4A, the magnetron sputtering or other manners may be used to deposit a material on the first electrode 1 at the ordinary temperature, the material may be ZnO, and thus the electron transport sub-layer with the C-axis orientation is formed.

Alternatively, S2 includes a step 21-2 (S21-2).

In S21-2, a magnetron sputtering process is used to deposit a material of the electron transport sub-layer 21 on the first electrode in a case where a temperature of the first electrode 1 is a second temperature, and the material of the electron transport sub-layer is annealed at the second temperature, so as to form an electron transport sub-layer with a C-axis orientation.

The second temperature is a temperature of the base that enables the deposited material to have the C-axis orientation, for example, the second temperature is in a range of 200° C. to 500° C., inclusive.

For example, the magnetron sputtering or other manners may be used to deposit a material on the first electrode 1 in a case where the temperature of the first electrode 1 is 300° C., the material may be ZnO, and the ZnO material is annealed, so as to form the electron transport sub-layer with the C-axis orientation.

The material of the electron transport sub-layer is annealed at the second temperature, so as to form the electron transport sub-layer with the C-axis orientation, which has an electric conductivity in the horizontal direction much lower than an electric conductivity in the vertical direction. Therefore, the side electric leakage of the film may be effectively reduced, and crosstalk phenomenon may be avoided.

Alternatively, S2 includes a step 21-3 (S21-3).

In S21-3, a magnetron sputtering process is used to deposit a material of the electron transport sub-layer on the first electrode 1 at a second sputtering power, so as to form an electron transport sub-layer with a C-axis orientation. The second sputtering power is a sputtering power that enables the material to have the C-axis orientation.

For example, the second sputtering power in the above magnetron sputtering process is in a range of 3 $W/cm^2$ to 30 $W/cm^2$. The second sputtering power is smaller than a first sputtering power, and the first sputtering power is a sputtering power that enables the material to have a non-C-axis orientation.

In a case where the formed electron transport layer 2 includes two electron transport sub-layers 21, S2 will be described. An electron transport sub-layer 21 away from the light-emitting layer 3 is an electron transport sub-layer with a non-C-axis orientation. The two electron transport sub-layers 21 are a first electron transport sub-layer 211 and a second electron transport sub-layer 210, and the first electron transport sub-layer 211 is farther away from the light-emitting layer 3.

Figures 16, 17A:
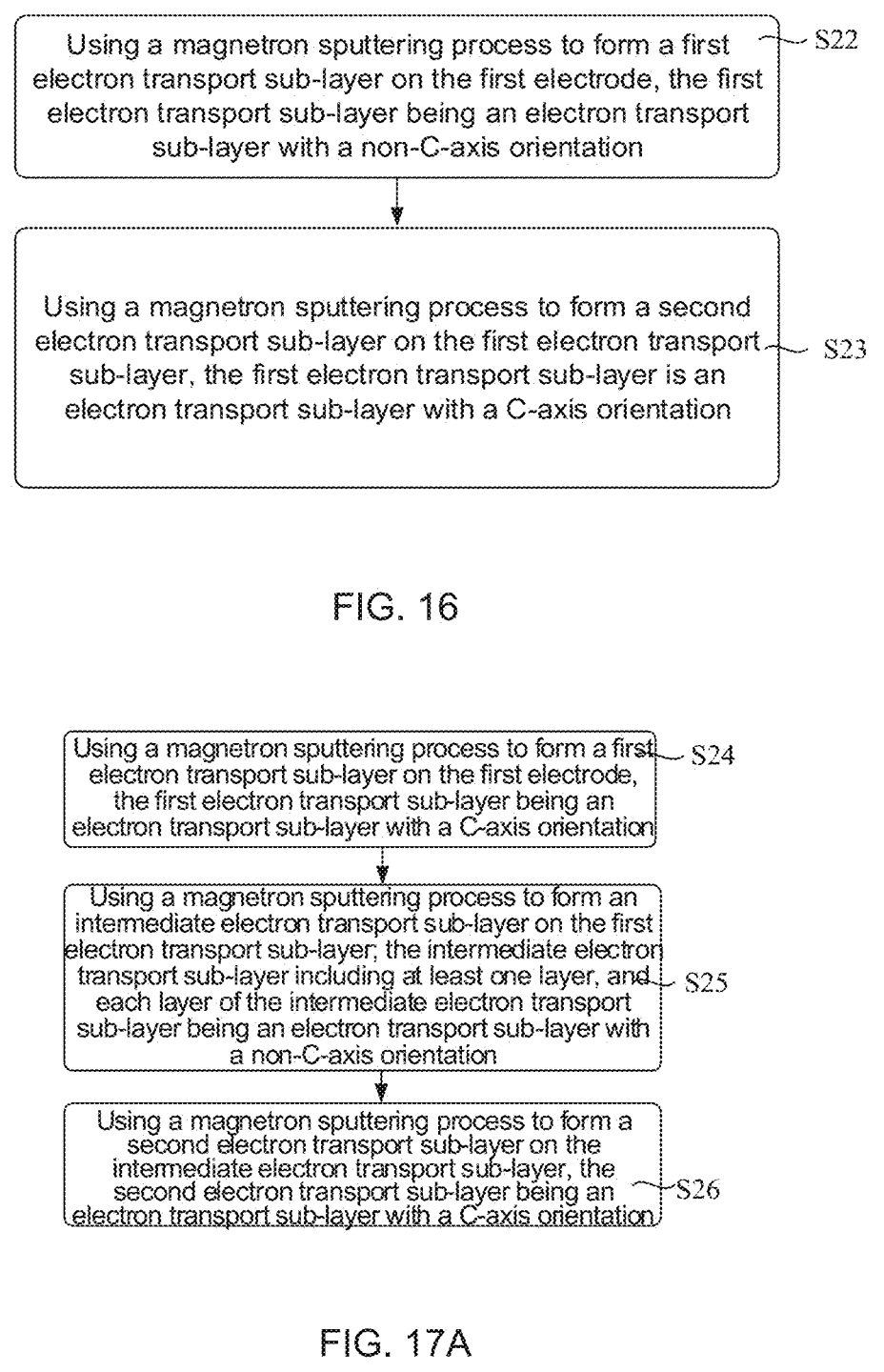

As shown in FIG. 16, forming the electron transport layer 2 on the first electrode 1 in step S2 includes steps 22 to 23 (S22 to S23).

In S22, a magnetron sputtering process is used to form a first electron transport sub-layer on the first electrode, and the first electron transport sub-layer is an electron transport sub-layer with a non-C-axis orientation.

In S23, a magnetron sputtering process is used to form a second electron transport sub-layer on the first electron transport sub-layer, and the first electron transport sub-layer is an electron transport sub-layer with a C-axis orientation.

In some embodiments, S22 includes a step 22-1 (S22-1).

In S22-1, a magnetron sputtering process is used to deposit a material of the electron transport sub-layer 21 on the first electrode 1 in a case where a temperature of the first electrode is a third temperature, so as to form a first electron transport sub-layer 211 with a non-C-axis orientation.

The third temperature is a temperature of the base that enables the material to have the non-C-axis orientation, for example, the third temperature is 100° C.

For example, as shown in FIG. 5A, the magnetron sputtering or other manners may be used to deposit a material on the first electrode 1 in a case where the temperature of the first electrode 1 is 100° C., the material may be ZnO, and thus the first electron transport sub-layer 211 with the non-C-axis orientation is formed.

Alternatively, S22 includes a step 22-2 (S22-2).

In S22-2, a magnetron sputtering process is used to deposit a material of the electron transport sub-layer on the first electrode at a first sputtering power, so as to form an electron transport sub-layer with a non-C-axis orientation. The first sputtering power is a sputtering power that enables the material to have the non-C-axis orientation.

For example, the first sputtering power in the magnetron sputtering process is in a range of 3 $W/cm^2$ to 30 $W/cm^2$. The second sputtering power is smaller than the first sputtering power.

In some embodiments, S23 includes a step 23-1 (S23-1).

In S23-1, a magnetron sputtering process is used to deposit a material of the electron transport sub-layer 21 on the first electron transport sub-layer 211 with the non-C-axis orientation in a case where the temperature of the first electron transport sub-layer 211 is the first temperature, so as to form a second electron transport sub-layer 210 with a C-axis orientation.

The first temperature is a temperature of the base that enables the material to have the C-axis orientation, for example, the first temperature is an ordinary temperature, i.e., 25° C.

For example, as shown in FIG. 5A, the magnetron sputtering or other manners may be used to deposit a material on the first electron transport sub-layer 211 with the non-C-axis orientation in a case where the temperature of the first electron transport sub-layer 211 is the ordinary temperature, the material may be ZnO, and thus the second electron transport sub-layer 210 with the C-axis orientation is formed.

In some examples, in a process of depositing the material of the electron transport sub-layer 21 to form the second electron transport sub-layer 210 in S23, oxygen may also be introduced to increase the oxygen content. Replacing argon with oxygen may reduce oxygen vacancies in the formed second electron transport sub-layer 210 with the C-axis orientation, and further reduce the electric conductivity, thereby balancing carriers and preventing current crosstalk, and improving the efficiency of the light-emitting device 10.

Alternatively, S23 includes a step 23-2 (S23-2).

In S23-2, a magnetron sputtering process is used to deposit a material of the electron transport sub-layer on the first electron transport sub-layer 211 with the non-C-axis orientation in a case where a temperature of the first electron transport sub-layer 211 is a second temperature, and the material of the electron transport sub-layer is annealed at the second temperature, so as to form a second electron transport sub-layer 210 with a C-axis orientation.

The second temperature is a temperature of the base that enables the deposited material to have the C-axis orientation, for example, the second temperature is in a range of 200° C. to 500° C., inclusive.

For example, as shown in FIG. 5A, the magnetron sputtering or other manners may be used to deposit a material on the first electron transport sub-layer 211 in a case where the temperature of the first electron transport sub-layer 211 is 300° C., the material may be ZnO, and the ZnO material is annealed, so as to form the second electron transport sub-layer 210 with the C-axis orientation.

For example, the second electron transport sub-layer 210 has the C-axis orientation, and has an electric conductivity in the horizontal direction much lower than an electric conductivity in the vertical direction. Therefore, the side electric leakage of the film may be effectively reduced, and crosstalk phenomenon may be avoided.

Alternatively, S23 includes a step 23-3 (S23-3).

In S23-3, a magnetron sputtering process is used to deposit a material of the electron transport sub-layer on the first electron transport sub-layer 211 at a second sputtering power, so as to form a second electron transport sub-layer 210 with a C-axis orientation. The second sputtering power is a sputtering power that enables the material to have the C-axis orientation.

For example, the second sputtering power in the above magnetron sputtering process is in a range of 3 $W/cm^2$ to 30 $W/cm^2$.

In some examples, in a process of depositing the material of the electron transport sub-layer 21 to form the second electron transport sub-layer 210 in S23, oxygen may also be introduced to increase the oxygen content. Replacing argon with oxygen may reduce oxygen vacancies in the formed second electron transport sub-layer 210 with the C-axis orientation, and further reduce the electric conductivity, thereby balancing carriers and preventing current crosstalk, and improving the efficiency of the light-emitting device 10.

In a case where the formed electron transport layer 2 includes three electron transport sub-layers 21, S2 will be described. An electron transport sub-layer 21 proximate to the light-emitting layer 3 is an electron transport sub-layer with a C-axis orientation, and an electron transport sub-layer 21 proximate the first electrode 1 is an electron transport sub-layer with a C-axis orientation or an electron transport sub-layer with a non-C-axis orientation. The three electron transport sub-layers include a first electron transport sub-layer, a second electron transport sub-layer, and an intermediate electron transport sub-layer. The first electron transport sub-layer is farthest away from the light-emitting layer, the second electron transport sub-layer is closest to the light-emitting layer, and the intermediate electron transport sub-layer is located between the first electron transport sub-layer and the second electron transport sub-layer, and is an electron transport sub-layer with a non-C-axis orientation.

As shown in FIG. 6A, the light-emitting device 10 is inverted. In a case where the electron transport layer 2 includes three electron transport sub-layers 21, as shown in FIG. 17A, forming the electron transport layer 2 on the first electrode 1 in step S2 includes steps 24 to 26 (S24 to S26).

In S24, a magnetron sputtering process is used to form a first electron transport sub-layer 211 on the first electrode 1, and the first electron transport sub-layer 211 is an electron transport sub-layer with a C-axis orientation.

In S25, a magnetron sputtering process is used to form an intermediate electron transport sub-layer 212 on the first electron transport sub-layer 211. The intermediate electron transport sub-layer 212 includes at least one layer, and each layer of the intermediate electron transport sub-layer 212 is an electron transport sub-layer with a non-C-axis orientation.

In S26, a magnetron sputtering process is used to form a second electron transport sub-layer 210 on the intermediate electron transport sub-layer 212, and the second electron transport sub-layer 210 is an electron transport sub-layer with a C-axis orientation.

In some embodiments, S24 includes a step 24-1 (S24-1).

In S24-1, a magnetron sputtering process is used to deposit a material of the electron transport sub-layer 21 on the first electrode 1 in a case where a temperature of the first electrode 1 is a first temperature, so as to form a first electron transport sub-layer 211 with a C-axis orientation.

The first temperature is a temperature of the base that enables the material to have the C-axis orientation, for example, the first temperature is an ordinary temperature, i.e., 25° C.

For example, as shown in FIG. 6A, the magnetron sputtering or other manners may be used to deposit a material on the first electrode 1 in a case where the temperature of the first electrode 1 is an ordinary temperature, the material may be ZnO, and thus the first electron transport sub-layer 211 with the C-axis orientation is formed.

Alternatively, S24 includes a step 24-2 (S24-2).

In S24-2, a magnetron sputtering process is used to deposit a material of the electron transport sub-layer on the first electrode 1 in a case where the temperature of the first electrode 1 is a second temperature, and the material of the electron transport sub-layer is annealed at the second temperature, so as to form a first electron transport sub-layer 211 with a C-axis orientation.

The second temperature is a temperature of the base that enables the deposited material to have the C-axis orientation, for example, the second temperature is in a range of 200° C. to 500° C., inclusive.

For example, as shown in FIG. 6A, the magnetron sputtering or other manners may be used to deposit a material on the first electrode 1 in a case where the temperature of the first electron transport sub-layer 211 is 300° C., the material may be ZnO, and the ZnO material is annealed, so as to form the first electron transport sub-layer 211 with the C-axis orientation.

For example, the first electron transport sub-layer 211 has the C-axis orientation, and has an electric conductivity in the horizontal direction much lower than an electric conductivity in the vertical direction. Therefore, the side electric leakage of the film may be effectively reduced, and crosstalk phenomenon may be avoided.

Alternatively, S24 includes a step 24-3 (S24-3).

In S24-3, as shown in FIG. 6A, a magnetron sputtering process is used to deposit a material of the electron transport sub-layer on the first electrode 1 at a second sputtering power, so as to form a first electron transport sub-layer 211 with a C-axis orientation. The second sputtering power is a sputtering power that enables the material to have the C-axis orientation.

For example, the second sputtering power in the above magnetron sputtering process is in a range of 3 W/cm$^2$ to 30 W/cm$^2$.

In some embodiments, S25 includes a step 25-1 (S25-1).

In S25-1, a magnetron sputtering process is used to deposit a material of the electron transport sub-layer 21 on the first electron transport sub-layer 211 in a case where a temperature of the first electron transport sub-layer 211 is a third temperature, so as to form an intermediate electron transport sub-layer 212 with a non-C-axis orientation.

The third temperature is a temperature of the base that enables the material to have the non-C-axis orientation, for example, the third temperature is 100° C.

For example, as shown in FIG. 6A, the magnetron sputtering or other manners may be used to deposit a material on the first electron transport sub-layer 211 in a case where the temperature of the first electron transport sub-layer 211 is 100° C., the material may be ZnO, and thus the intermediate electron transport sub-layer 212 with the non-C-axis orientation is formed.

Alternatively, S25 includes a step 25-2 (S25-2).

In S25-2, a magnetron sputtering process is used to deposit a material of the electron transport sub-layer on the first electron transport sub-layer 211 at a first sputtering power, so as to form an electron transport sub-layer with a non-C-axis orientation. The first sputtering power is a sputtering power that enables the material to have the non-C-axis orientation.

For example, the first sputtering power in the magnetron sputtering process is in a range of 3 W/cm$^2$ to 30 W/cm$^2$. The second sputtering power is smaller than the first sputtering power.

In some embodiments, S26 includes a step 26-1 (S26-1).

In S26-1, a magnetron sputtering process is used to deposit a material of the electron transport sub-layer 21 on the intermediate electron transport sub-layer 212 in a case where a temperature of the intermediate electron transport sub-layer 212 is a first temperature, so as to form a second electron transport sub-layer 210 with a C-axis orientation.

The first temperature is a temperature of the base that enables the material to have the C-axis orientation, for example, the first temperature is an ordinary temperature, i.e., 25° C.

For example, as shown in FIG. 6A, the magnetron sputtering or other manners may be used to deposit a material on the intermediate electron transport sub-layer 212 in a case where the temperature of the intermediate electron transport sub-layer 212 is the ordinary temperature, the material may be ZnO, and thus the second electron transport sub-layer 210 with the C-axis orientation is formed.

Alternatively, S26 includes a step 26-2 (S26-2).

In S26-2, a magnetron sputtering process is used to deposit a material of the electron transport sub-layer on the intermediate electron transport sub-layer 212 in a case where a temperature of the intermediate electron transport sub-layer 212 is a second temperature, and the material of the electron transport sub-layer is annealed at the second temperature, so as to form a second electron transport sub-layer 210 with a C-axis orientation.

The second temperature is a temperature of the base that enables the deposited material to have the C-axis orientation, for example, the second temperature is in a range of 200° C. to 500° C., inclusive.

For example, as shown in FIG. 6A, the magnetron sputtering or other manners may be used to deposit a material on the intermediate electron transport sub-layer 212 in a case where the temperature of the intermediate electron transport sub-layer 212 is 300° C., the material may be ZnO, and the ZnO material is annealed, so as to form the second electron transport sub-layer 210 with the C-axis orientation.

For example, the second electron transport sub-layer 210 has the C-axis orientation, and has an electric conductivity in the horizontal direction much lower than an electric conductivity in the vertical direction. Therefore, the side electric leakage of the film may be effectively reduced, and crosstalk phenomenon may be avoided.

Alternatively, S26 includes a step 26-3 (S26-3).

In S26-3, a magnetron sputtering process is used to deposit a material of the electron transport sub-layer on the intermediate electron transport sub-layer 212 at a second sputtering power, so as to form a second electron transport sub-layer 210 with a C-axis orientation. The second sputtering power is a sputtering power that enables the material to have the C-axis orientation.

For example, the second sputtering power in the above magnetron sputtering process is in a range of 3 W/cm$^2$ to 30 W/cm$^2$.

Figure 17B:
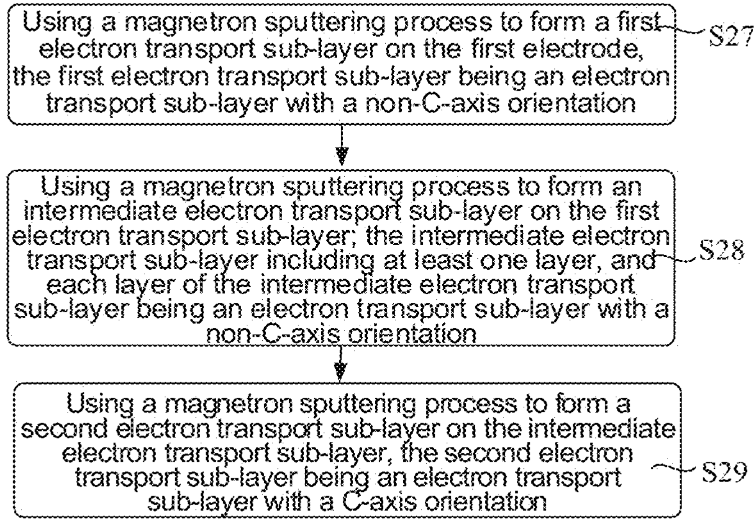
FIG. 17B is a flow diagram of yet another method for manufacturing a light-emitting device, in accordance with some embodiments of the present disclosure.

In other embodiments, in a case where the electron transport layer 2 includes three electron transport sub-layers 21, as shown in FIG. 17B, forming the electron transport layer 2 on the first electrode 1 in step S2 correspondingly includes steps 27 to 29 (S27 to S29). It will be noted that S27 to S29 and S24 to S26 may be interchanged.

In S27, a magnetron sputtering process is used to form a first electron transport sub-layer 211 on the first electrode 1, and the first electron transport sub-layer 211 is an electron transport sub-layer with a non-C-axis orientation.

In S28, a magnetron sputtering process is used to form an intermediate electron transport sub-layer 212 on the first electron transport sub-layer 211. The intermediate electron transport sub-layer 212 includes at least one layer, and each layer of the intermediate electron transport sub-layer 212 is an electron transport sub-layer with a non-C-axis orientation.

In S29, a magnetron sputtering process is used to form a second electron transport sub-layer 210 on the intermediate electron transport sub-layer 212, and the second electron transport sub-layer 210 is an electron transport sub-layer with a C-axis orientation.

In some embodiments, S27 includes a step 27-1 (S27-1).

In S27-1, a magnetron sputtering process is used to deposit a material of the electron transport sub-layer 21 on the first electrode 1 in a case where a temperature of the first electrode 1 is a third temperature, so as to form a first electron transport sub-layer 211 with a non-C-axis orientation.

The third temperature is a temperature of the base that enables the material to have the non-C-axis orientation, for example, the third temperature is 100° C.

For example, as shown in FIG. 6A, the magnetron sputtering or other manners may be used to deposit a material on the first electrode 1 in a case where the temperature of the first electrode 1 is 100° C., the material may be ZnO, and thus the first electron transport sub-layer 211 with the non-C-axis orientation is formed.

Alternatively, S27 includes a step 27-2 (S27-2).

In S27-2, a magnetron sputtering process is used to deposit a material of the electron transport sub-layer on the first electrode 1 at a first sputtering power, so as to form an electron transport sub-layer with a non-C-axis orientation. The first sputtering power is a sputtering power that enables the material to have the non-C-axis orientation.

For example, the first sputtering power in the above magnetron sputtering process is in a range of 3 $W/cm^2$ to 30 $W/cm^2$, and the second sputtering power is smaller than the first sputtering power.

For the specific process steps of S28, reference may be made to the introduction of S25, and for the specific process steps of S29, reference may be made to the introduction of S26.

In some embodiments, the electron transport layer in the light-emitting device includes more than three electron transport sub-layers. The intermediate electron transport sub-layer 212 includes at least two electron transport sub-layers 21, and each electron transport sub-layer in the at least two electron transport sub-layers 21 is an intermediate electron transport sub-layer 212 with a non-C-axis orientation. The method of forming each intermediate electron transport sub-layer 212 with the non-C-axis orientation refers to the specific method of forming the intermediate electron transport sub-layer 212 in the above case where the electron transport layer 2 includes three electron transport sub-layers, and details are not be repeated here.

The method of forming the electron transport layer 2 in the upright light-emitting device will be described in different situations below.

In a case where the formed electron transport layer 2 includes one electron transport sub-layer 21 (as shown in FIG. 4B), S4' will be described. The single electron transport sub-layer 21 is an electron transport sub-layer 21 with a C-axis orientation.

As shown in FIG. 15B, forming the electron transport layer 2 on the light-emitting layer 3 in step S4' includes: forming the electron transport layer with the C-axis orientation on the light-emitting layer 3 by using a magnetron sputtering process. In some embodiments, S4' includes a step 41-1 (S41-1).

In S41-1, a magnetron sputtering process is used to deposit a material of the electron transport sub-layer 21 on the light-emitting layer 3 in a case where a temperature of the light-emitting layer 3 is a first temperature, so as to form an electron transport sub-layer with a C-axis orientation.

The first temperature is a temperature of the base that enables the material to have the C-axis orientation, for example, the first temperature is an ordinary temperature, i.e., 25° C.

For example, as shown in FIG. 4B, the magnetron sputtering or other manners may be used to deposit a material on the light-emitting layer 3 at the ordinary temperature, the material may be ZnO, and thus the electron transport sub-layer with the C-axis orientation is formed.

Alternatively, S4' includes a step 41-2 (S41-2).

In S41-2, a magnetron sputtering process is used to deposit a material of the electron transport sub-layer on the light-emitting layer 3 in a case where a temperature of the light-emitting layer 3 is a second temperature, and the material of the electron transport sub-layer is annealed at the second temperature, so as to form an electron transport sub-layer with a C-axis orientation.

The second temperature is a temperature of the base that enables the deposited material to have the C-axis orientation, for example, the second temperature is in a range of 200° C. to 500° C., inclusive.

For example, as shown in FIG. 4B, the magnetron sputtering or other manners may be used to deposit a material on the light-emitting layer 3 in a case where the temperature of the light-emitting layer 3 is 300° C., the material may be ZnO, and the ZnO material is annealed, so as to form the electron transport sub-layer with the C-axis orientation.

The material of the electron transport sub-layer is annealed at the second temperature, so as to form the electron transport sub-layer with the C-axis orientation, which has an electric conductivity in the horizontal direction much lower than an electric conductivity in the vertical direction. Therefore, the side electric leakage of the film may be effectively reduced, and crosstalk phenomenon may be avoided.

Alternatively, S4' includes a step 41-3 (S41-3).

In S41-3, as shown in FIG. 4B, a magnetron sputtering process is used to deposit a material of the electron transport sub-layer on the light-emitting layer 3 at a second sputtering power, so as to form an electron transport sub-layer with a C-axis orientation. The second sputtering power is a sputtering power that enables the material to have the C-axis orientation.

For example, the second sputtering power in the above magnetron sputtering process is in a range of 3 $W/cm^2$ to 30 $W/cm^2$. The second sputtering power is smaller than a first sputtering power, and the first sputtering power is a sputtering power that enables the material to have a non-C-axis orientation.

In a case where the formed electron transport layer 2 includes two electron transport sub-layers 21, S4' will be described. An electron transport sub-layer 21 away from the light-emitting layer 3 is an electron transport sub-layer with a non-C-axis orientation. The two electron transport sub-layers 21 are a first electron transport sub-layer 211 and a second electron transport sub-layer 210, and the first electron transport sub-layer 211 is farther away from the light-emitting layer 3.

Figure 18:
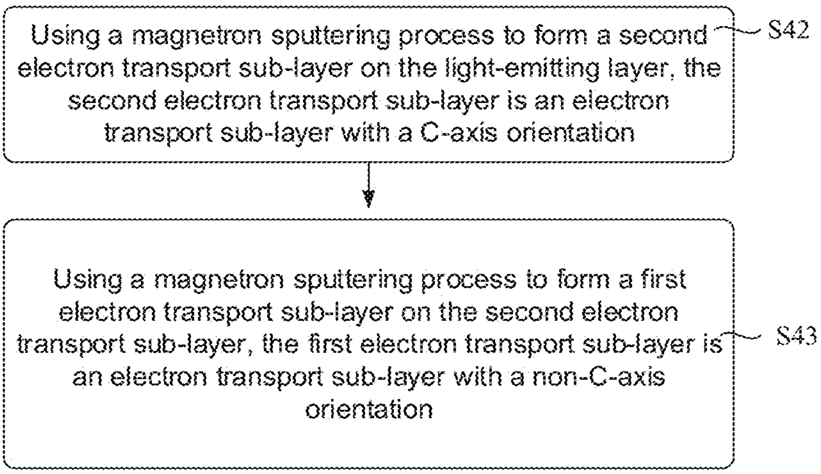
FIG. 18 is a flow diagram of yet another method for manufacturing a light-emitting device, in accordance with some embodiments of the present disclosure.

As shown in FIG. 18, forming the electron transport layer 2 on the light-emitting layer 3 in step S4' includes steps 42 to 43 (S42 to S43).

In S42, a magnetron sputtering process is used to form a second electron transport sub-layer on the light-emitting layer 3, and the second electron transport sub-layer is an electron transport sub-layer with a C-axis orientation.

In S43, a magnetron sputtering process is used to form a first electron transport sub-layer on the second electron transport sub-layer, and the first electron transport sub-layer is an electron transport sub-layer with a non-C-axis orientation.

In some embodiments, S42 includes a step 42-1 (S42-1).

In S42-1, a magnetron sputtering process is used to deposit a material of the electron transport sub-layer 21 on the light-emitting layer 3 in a case where a temperature of the light-emitting layer 3 is a first temperature, so as to form a second electron transport sub-layer 210 with a C-axis orientation.

The first temperature is a temperature of the base that enables the material to have the C-axis orientation, for example, the first temperature is an ordinary temperature, i.e., 25° C.

For example, as shown in FIG. 5B, the magnetron sputtering or other manners may be used to deposit a material on the light-emitting layer 3 in a case where the temperature of the light-emitting layer 3 is the ordinary temperature, the material may be ZnO, and thus the second electron transport sub-layer 210 with the C-axis orientation is formed.

In some examples, in a process of depositing the material of the electron transport sub-layer 21 to form the second electron transport sub-layer 210 in S42, oxygen may also be introduced to increase the oxygen content. Replacing argon with oxygen may reduce oxygen vacancies in the formed second electron transport sub-layer 210 with the C-axis orientation, and further reduce the electric conductivity, thereby balancing carriers and preventing current crosstalk, and improving the efficiency of the light-emitting device 10.

Alternatively, S42 includes a step 42-2 (S42-2).

In S42-2, a magnetron sputtering process is used to deposit a material of the electron transport sub-layer on the light-emitting layer 3 in a case where a temperature of the light-emitting layer 3 is a second temperature, and the material of the electron transport sub-layer is annealed at the second temperature, so as to form a second electron transport sub-layer 210 with a C-axis orientation.

The second temperature is a temperature of the base that enables the deposited material to have the C-axis orientation, for example, the second temperature is in a range of 200° C. to 500° C., inclusive.

For example, as shown in FIG. 5B, the magnetron sputtering or other manners may be used to deposit a material on the light-emitting layer 3 in a case where the temperature of the light-emitting layer 3 is 300° C., the material may be ZnO, and the ZnO material is annealed, so as to form the second electron transport sub-layer 210 with the C-axis orientation.

For example, the second electron transport sub-layer 210 has the C-axis orientation, and has an electric conductivity in the horizontal direction much lower than an electric conductivity in the vertical direction. Therefore, the side electric leakage of the film may be effectively reduced, and crosstalk phenomenon may be avoided.

Alternatively, S42 includes a step 42-3 (S42-3).

In S42-3, as shown in FIG. 5B, a magnetron sputtering process is used to deposit a material of the electron transport sub-layer on the light-emitting layer 3 at a second sputtering power, so as to form a second electron transport sub-layer 210 with a C-axis orientation. The second sputtering power is a sputtering power that enables the material to have the C-axis orientation.

For example, the second sputtering power in the above magnetron sputtering process is in a range of 3 $W/cm^2$ to 30 $W/cm^2$.

In some embodiments, S43 includes a step 43-1 (S43-1).

In S43-1, a magnetron sputtering process is used to deposit a material of the electron transport sub-layer 21 on the second electron transport sub-layer 210 in a case where a temperature of the second electron transport sub-layer 210 is a third temperature, so as to form a first electron transport sub-layer 211 with a non-C-axis orientation.

The third temperature is a temperature of the base that enables the material to have the non-C-axis orientation, for example, the third temperature is 100° C.

For example, as shown in FIG. 5B, the magnetron sputtering or other manners may be used to deposit a material on the second electron transport sub-layer 210 in a case where the temperature of the second electron transport sub-layer 210 is 100° C., the material may be ZnO, and thus the first electron transport sub-layer 211 with the non-C-axis orientation is formed.

Alternatively, S43 includes a step 43-2 (S43-2).

In S43-2, as shown in FIG. 5B, a magnetron sputtering process is used to deposit a material of the electron transport sub-layer on the second electron transport sub-layer 210 at a first sputtering power, so as to form an electron transport sub-layer with a non-C-axis orientation. The first sputtering power is a sputtering power that enables the material to have the non-C-axis orientation.

For example, the first sputtering power in the above magnetron sputtering process is in a range of 3 $W/cm^2$ to 30 $W/cm^2$. The second sputtering power is smaller than the first sputtering power.

In a case where the formed electron transport layer 2 includes three electron transport sub-layers 21, S4' will be described. An electron transport sub-layer 21 proximate to the light-emitting layer 3 is an electron transport sub-layer with a C-axis orientation, and an electron transport sub-layer 21 proximate the first electrode 1 is an electron transport sub-layer with a C-axis orientation or an electron transport sub-layer with a non-C-axis orientation. The three electron transport sub-layers include a first electron transport sub-layer, a second electron transport sub-layer, and an intermediate electron transport sub-layer. The first electron transport sub-layer is farthest away from the light-emitting layer, the second electron transport sub-layer is closest to the light-emitting layer, and the intermediate electron transport sub-layer is located between the first electron transport sub-layer and the second electron transport sub-layer, and is an electron transport sub-layer with a non-C-axis orientation.

Figure 19A:
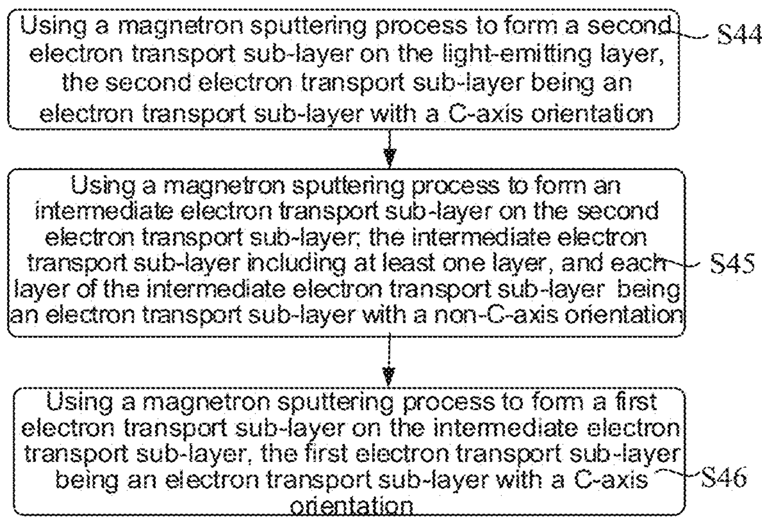
FIG. 19A is a flow diagram of yet another method for manufacturing a light-emitting device, in accordance with some embodiments of the present disclosure.

As shown in FIG. 6B, the light-emitting device 10 is upright. In a case where the electron transport layer 2 includes three electron transport sub-layers 21, as shown in FIG. 19A, forming the electron transport layer 2 on the light-emitting layer 3 in step S4' correspondingly includes steps 44 to 46 (S44 to S46).

In S44, a magnetron sputtering process is used to form a second electron transport sub-layer 210 on the light-emitting layer 3, and the second electron transport sub-layer 210 is an electron transport sub-layer with a C-axis orientation.

In S45, a magnetron sputtering process is used to form an intermediate electron transport sub-layer 212 on the second electron transport sub-layer 210. The intermediate electron transport sub-layer 212 includes at least one layer, and each layer of the intermediate electron transport sub-layer 212 is an electron transport sub-layer with a non-C-axis orientation.

In S46, a magnetron sputtering process is used to form a first electron transport sub-layer 211 on the intermediate electron transport sub-layer 212, and the first electron transport sub-layer 211 is an electron transport sub-layer with a C-axis orientation.

In some embodiments, S44 includes a step 44-1 (S44-1).

In S44-1, a magnetron sputtering process is used to deposit a material of the electron transport sub-layer 21 on the light-emitting layer 3 in a case where a temperature of the light-emitting layer 3 is a first temperature, so as to form a second electron transport sub-layer 210 with a C-axis orientation.

The first temperature is a temperature of the base that enables the material to have the C-axis orientation, for example, the first temperature is an ordinary temperature, i.e., 25° C.

For example, as shown in FIG. 6B, the magnetron sputtering or other manners may be used to deposit a material on the light-emitting layer 3 in a case where the temperature of the light-emitting layer 3 is an ordinary temperature, the material may be ZnO, and thus the second electron transport sub-layer 210 with the C-axis orientation is formed.

Alternatively, S44 includes a step 44-2 (S44-2).

In S44-2, a magnetron sputtering process is used to deposit a material of the electron transport sub-layer on the light-emitting layer 3 in a case where the temperature of the light-emitting layer 3 is a second temperature, and the material of the electron transport sub-layer is annealed at the second temperature, so as to form a second electron transport sub-layer 210 with a C-axis orientation.

The second temperature is a temperature of the base that enables the deposited material to have the C-axis orientation, for example, the second temperature is in a range of 200° C. to 500° C., inclusive.

For example, as shown in FIG. 6B, the magnetron sputtering or other manners may be used to deposit a material on the light-emitting layer 3 in a case where the temperature of the light-emitting layer 3 is 300° C., the material may be ZnO, and the ZnO material is annealed, so as to form the second electron transport sub-layer 210 with the C-axis orientation.

For example, the second electron transport sub-layer 210 has the C-axis orientation, and has an electric conductivity in the horizontal direction much lower than an electric conductivity in the vertical direction. Therefore, the side electric leakage of the film may be effectively reduced, and crosstalk phenomenon may be avoided.

Alternatively, S44 includes a step 44-3 (S44-3).

In S44-3, as shown in FIG. 6B, a magnetron sputtering process is used to deposit a material of the electron transport sub-layer on the light-emitting layer 3 at a second sputtering power, so as to form a second electron transport sub-layer 210 with a C-axis orientation. The second sputtering power is a sputtering power that enables the material to have the C-axis orientation.

For example, the second sputtering power in the above magnetron sputtering process is in a range of 3 W/cm$^2$ to 30 W/cm$^2$.

In some embodiments, S45 includes a step 45-1 (S45-1).

In S45-1, a magnetron sputtering process is used to deposit a material of the electron transport sub-layer 21 on the second electron transport sub-layer 210 in a case where a temperature of the second electron transport sub-layer 210 is a third temperature, so as to form an intermediate electron transport sub-layer 212 with a non-C-axis orientation.

The third temperature is a temperature of the base that enables the material to have the non-C-axis orientation, for example, the third temperature is 100° C.

For example, as shown in FIG. 6B, the magnetron sputtering or other manners may be used to deposit a material on the electron transport sub-layer 210 in a case where the temperature of the electron transport sub-layer 210 is 100° C., the material may be ZnO, and thus the intermediate electron transport sub-layer 212 with the non-C-axis orientation is formed.

Alternatively, S45 includes a step 45-2 (S45-2).

In S45-2, as shown in FIG. 6B, a magnetron sputtering process is used to deposit a material of the electron transport sub-layer on the second electron transport sub-layer 210 at a first sputtering power, so as to form an electron transport sub-layer with a non-C-axis orientation. The first sputtering power is a sputtering power that enables the material to have the non-C-axis orientation.

For example, the first sputtering power in the magnetron sputtering process is in a range of 3 W/cm$^2$ to 30 W/cm$^2$. The second sputtering power is smaller than the first sputtering power.

In some embodiments, S46 includes a step 46-1 (S46-1).

In S46-1, a magnetron sputtering process is used to deposit a material of the electron transport sub-layer 21 on the intermediate electron transport sub-layer 212 in a case where a temperature of the intermediate electron transport sub-layer 212 is a first temperature, so as to form a first electron transport sub-layer 211 with a C-axis orientation.

The first temperature is a temperature of the base that enables the material to have the C-axis orientation, for example, the first temperature is an ordinary temperature, i.e., 25° C.

For example, as shown in FIG. 6B, the magnetron sputtering or other manners may be used to deposit a material on the intermediate electron transport sub-layer 212 in a case where the temperature of the intermediate electron transport sub-layer 212 is the ordinary temperature, the material may be ZnO, and thus the first electron transport sub-layer 211 with the C-axis orientation is formed.

Alternatively, S46 includes a step 46-2 (S46-2).

In S46-2, a magnetron sputtering process is used to deposit a material of the electron transport sub-layer on the intermediate electron transport sub-layer 212 in a case where a temperature of the intermediate electron transport sub-layer 212 is a second temperature, and the material of the electron transport sub-layer is annealed at the second temperature, so as to form a first electron transport sub-layer 211 with a C-axis orientation.

The second temperature is a temperature of the base that enables the deposited material to have the C-axis orientation, for example, the second temperature is in a range of 200° C. to 500° C., inclusive.

For example, as shown in FIG. 6B, the magnetron sputtering or other manners may be used to deposit a material on the intermediate electron transport sub-layer 212 in a case where the temperature of the intermediate electron transport sub-layer 212 is 300° C., the material may be ZnO, and the ZnO material is annealed, so as to form the first electron transport sub-layer 211 with the C-axis orientation.

For example, the first electron transport sub-layer 211 has the C-axis orientation, and has an electric conductivity in the horizontal direction much lower than an electric conductivity in the vertical direction. Therefore, the side electric leakage of the film may be effectively reduced, and crosstalk phenomenon may be avoided.

Alternatively, S46 includes a step 46-3 (S46-3).

In S46-3, as shown in FIG. 6B, a magnetron sputtering process is used to deposit a material of the electron transport sub-layer on the intermediate electron transport sub-layer 212 at a second sputtering power, so as to form a first electron transport sub-layer 211 with a C-axis orientation. The second sputtering power is a sputtering power that enables the material to have the C-axis orientation.

For example, the second sputtering power in the above magnetron sputtering process is in a range of 3 W/cm$^2$ to 30 W/cm$^2$.

Figure 19B:
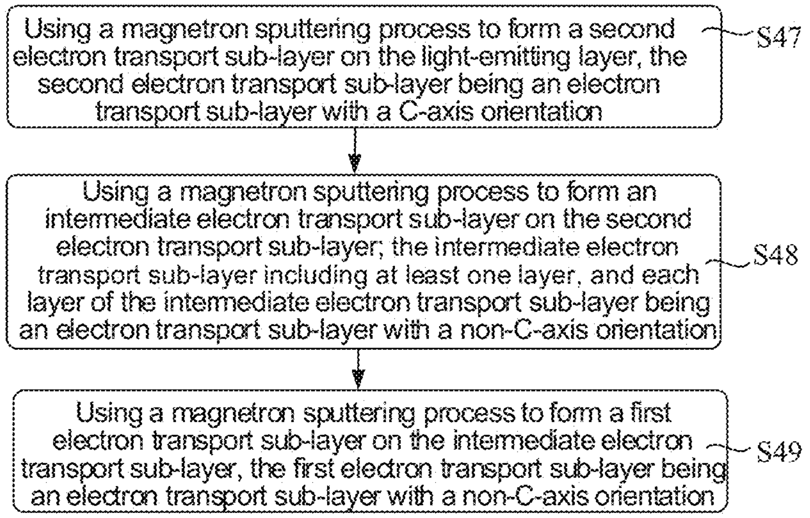
FIG. 19B is a flow diagram of yet another method for manufacturing a light-emitting device, in accordance with some embodiments of the present disclosure.

In other embodiments, in a case where the electron transport layer 2 includes three electron transport sub-layers 21, as shown in FIG. 19B, forming the electron transport layer 2 on the light-emitting layer 3 in step S4' correspondingly includes steps 47 to 49 (S47 to S49).

In S47, a magnetron sputtering process is used to form a second electron transport sub-layer 210 on the light-emitting layer 3, and the second electron transport sub-layer 210 is an electron transport sub-layer with a C-axis orientation.

In S48, a magnetron sputtering process is used to form an intermediate electron transport sub-layer 212 on the second electron transport sub-layer 210. The intermediate electron transport sub-layer 212 includes at least one layer, and each layer of the intermediate electron transport sub-layer 212 is an electron transport sub-layer with a non-C-axis orientation.

In S49, a magnetron sputtering process is used to form a first electron transport sub-layer 211 on the intermediate electron transport sub-layer 212, and the first electron transport sub-layer 211 is an electron transport sub-layer with a non-C-axis orientation.

In some embodiments, S47 includes a step 47-1 (S47-1).

In S47-1, a magnetron sputtering process is used to deposit a material of the electron transport sub-layer 21 on the light-emitting layer 3 in a case where a temperature of the light-emitting layer 3 is a first temperature, so as to form a second electron transport sub-layer 210 with a C-axis orientation.

The first temperature is a temperature of the base that enables the material to have the C-axis orientation, for example, the first temperature is an ordinary temperature, i.e., 25° C.

For example, as shown in FIG. 6B, the magnetron sputtering or other manners may be used to deposit a material on the light-emitting layer 3 in a case where the temperature of the light-emitting layer 3 is an ordinary temperature, the material may be ZnO, and thus the second electron transport sub-layer 210 with the C-axis orientation is formed.

Alternatively, S47 includes a step 47-2 (S47-2).

In S47-2, a magnetron sputtering process is used to deposit a material of the electron transport sub-layer on the light-emitting layer 3 in a case where the temperature of the light-emitting layer 3 is a second temperature, and the material of the electron transport sub-layer is annealed at the second temperature, so as to form a second electron transport sub-layer 210 with a C-axis orientation.

The second temperature is a temperature of the base that enables the deposited material to have the C-axis orientation, for example, the second temperature is in a range of 200° C. to 500° C., inclusive.

For example, as shown in FIG. 6B, the magnetron sputtering or other manners may be used to deposit a material on the light-emitting layer 3 in a case where the temperature of the light-emitting layer 3 is 300° C., the material may be ZnO, and the ZnO material is annealed, so as to form the second electron transport sub-layer 210 with the C-axis orientation.

For example, the second electron transport sub-layer 210 has the C-axis orientation, and has an electric conductivity in the horizontal direction much lower than an electric conductivity in the vertical direction. Therefore, the side electric leakage of the film may be effectively reduced, and crosstalk phenomenon may be avoided.

Alternatively, S47 includes a step 47-3 (S47-3).

In S47-3, as shown in FIG. 6B, a magnetron sputtering process is used to deposit a material of the electron transport sub-layer on the light-emitting layer 3 at a second sputtering power, so as to form a second electron transport sub-layer 210 with a C-axis orientation. The second sputtering power is a sputtering power that enables the material to have the C-axis orientation.

For example, the second sputtering power in the above magnetron sputtering process is in a range of 3 W/cm$^2$ to 30 W/cm$^2$.

For the specific process steps of S48, reference may be made to the introduction of S45.

In some embodiments, S49 includes a step 49-1 (S49-1).

In S49-1, a magnetron sputtering process is used to deposit a material of the electron transport sub-layer 21 on the intermediate electron transport sub-layer 212 in a case where a temperature of the intermediate electron transport sub-layer 212 is a third temperature, so as to form a first electron transport sub-layer 211 with a non-C-axis orientation.

The third temperature is a temperature of the base that enables the material to have the non-C-axis orientation, for example, the third temperature is 100° C.

For example, as shown in FIG. 6B, the magnetron sputtering or other manners may be used to deposit a material on the intermediate electron transport sub-layer 212 in a case where the temperature of the intermediate electron transport sub-layer 212 is 100° C., the material may be ZnO, and thus the first electron transport sub-layer 211 with the non-C-axis orientation is formed.

Alternatively, S49 includes a step 49-2 (S49-2).

In S49-2, as shown in FIG. 6B, a magnetron sputtering process is used to deposit a material of the electron transport sub-layer on the intermediate electron transport sub-layer 212 at a first sputtering power, so as to form an electron transport sub-layer with a non-C-axis orientation. The first sputtering power is a sputtering power that enables the material to have the non-C-axis orientation.

For example, the first sputtering power in the above magnetron sputtering process is in a range of 3 W/cm$^2$ to 30 W/cm$^2$. The second sputtering power is smaller than the first sputtering power.

In some embodiments, the intermediate electron transport sub-layer 212 includes at least two electron transport sub-layers 21, and each electron transport sub-layer 21 in the at least two electron transport sub-layers 21 is an intermediate electron transport sub-layer 212 with a non-C-axis orientation. The method of forming the intermediate electron transport sub-layer 212 with the non-C-axis orientation refers to the specific method of forming the intermediate electron transport sub-layer 212 in the above case where the electron transport layer 2 includes three electron transport sub-layers, and details are not be repeated here.

Figure 20:
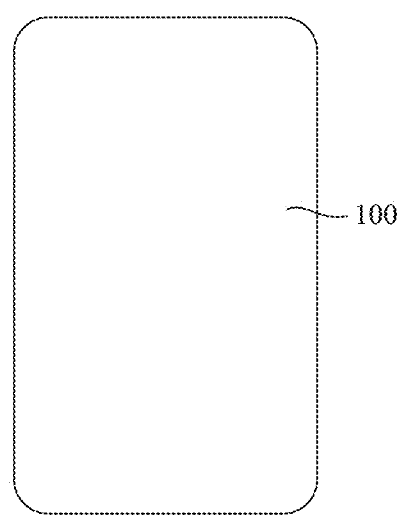
FIG. 20 is a diagram showing a structure of a display substrate, in accordance with some embodiments.
Figure 21A:
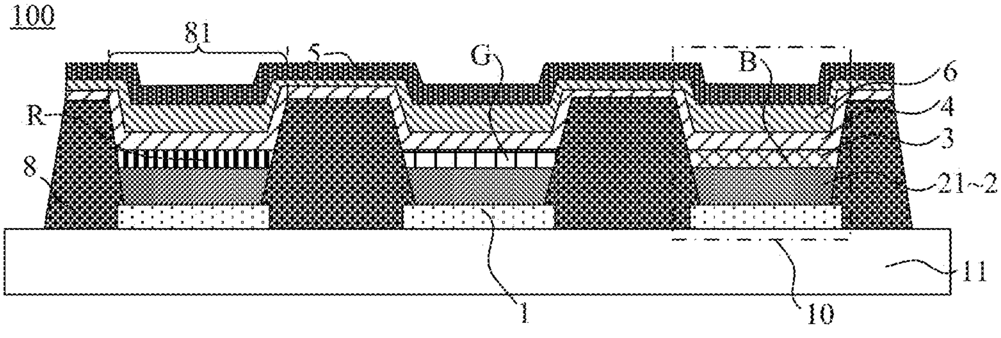
FIG. 21A is a diagram showing a structure of a display substrate, in accordance with some embodiments of the present disclosure.

Some embodiments of the present disclosure further provide a display substrate 100. As shown in FIGS. 20 and 21A, the display substrate 100 includes light-emitting devices 10 each as described above.

The display substrate 100 may be, for example, a quantum dot light-emitting diode (QLED) display substrate, a mini light-emitting diode (mini LED) display substrate, or a micro light-emitting diode (micro LED) display substrate.

Figure 21B:
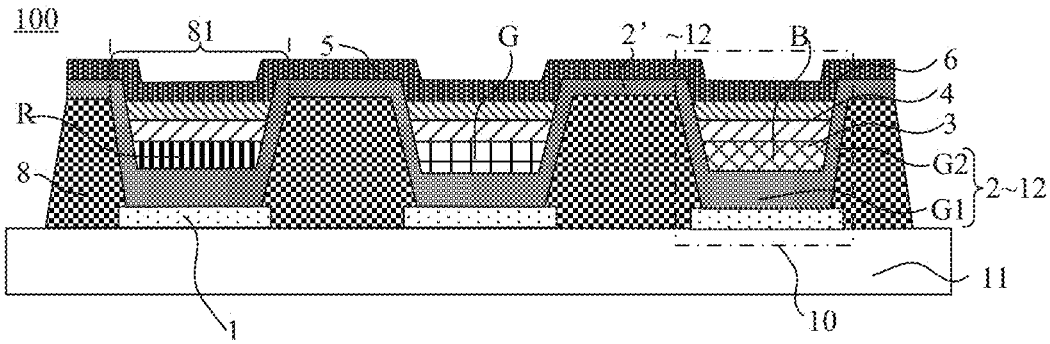
FIG. 21B is a diagram showing a structure of another display substrate, in accordance with some embodiments of the present disclosure.

In some embodiments, as shown in FIGS. 21A and 21B, the display substrate 100 includes a substrate 11 and a pixel defining layer 8 disposed on a side of the substrate 11. The pixel defining layer 8 includes a plurality of openings 81. First electrodes 1 of a plurality of light-emitting devices 10 are arranged between the substrate 11 and the pixel defining layer 8. Each opening 81 exposes at least a part of a first electrode 1 of a light-emitting device 10. The electron transport layer 2, the light-emitting layer 3, the hole transport layer 4 and the second electrode 5 of the light-emitting device 10 are sequentially arranged on the first electrode 1 and located in the opening 81. The light-emitting device has an inverted structure.

Figure 21C:
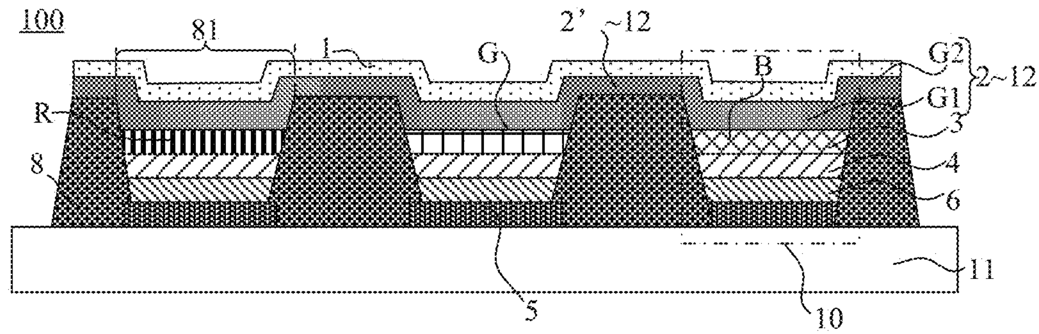
FIG. 21C is a diagram showing a structure of yet another display substrate, in accordance with some embodiments of the present disclosure.
Figure 21D:
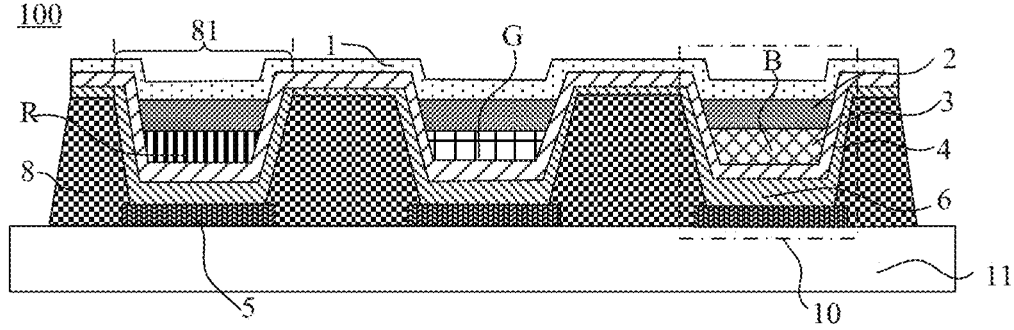
FIG. 21D is a diagram showing a structure of yet another display substrate, in accordance with some embodiments of the present disclosure.

In other embodiments, as shown in FIGS. 21C and 21D, the display substrate 100 includes a substrate 11 and a pixel defining layer 8 disposed on a side of the substrate 11. The pixel defining layer 8 includes a plurality of openings 81. Second electrodes 5 of a plurality of light-emitting devices 10 are arranged between the substrate 11 and the pixel defining layer 8. Each opening 81 exposes at least a part of a second electrode 5 of a light-emitting device 10. The hole transport layer 4, the light-emitting layer 3, the electron transport layer 2 and the first electrode 1 of the light-emitting device 10 are sequentially arranged on the second electrode 5 and located in the opening 81. The light-emitting device has an upright structure.

In some embodiments, the display substrate 100 includes a plurality of sub-pixels. Each sub-pixel includes at least one light-emitting device, and the plurality of sub-pixels are red sub-pixels, green sub-pixels and blue sub-pixels. The light-emitting layers of light-emitting devices in the red sub-pixel, the green sub-pixel and the blue sub-pixel have different material. As shown in FIGS. 21A to 21D, R, G and B represent a light-emitting layer in the red sub-pixel, a light-emitting layer in the green sub-pixel, and a light-emitting layer in the blue sub-pixel, respectively. The display substrate 100 can emit light of three different colors of red, green and blue.

As shown in FIGS. 21A and 21B, in a case where the light-emitting devices included in the display substrate have inverted structures, the structure of all film layers included in the light-emitting device has the following embodiments.

In some embodiments, as shown in FIG. 21A, the electron transport layers 2 of the light-emitting devices 10 are located in the openings 81, and electron transport layers 2 of the plurality of light-emitting devices 10 are not in contact with each other.

For example, the electron transport layers 2 of the plurality of light-emitting devices 10 are not in contact with each other, that is, the electron transport layers 2 of the plurality of light-emitting devices 10 are not shared. In a manufacturing process, an initial electron transport layer provided as a whole layer is needed to be patterned by exposing and etching, so as to form a plurality of electron transport layers 2 respectively located in a plurality of openings, which may further reduce the crosstalk of electrical signals and improve device efficiency.

In some examples, the hole transport layers 4 of the plurality of light-emitting devices 10 are in contact with each other, and the hole injection layers 6 of the plurality of light-emitting devices 10 are in contact with each other, so that both the hole transport layers 4 and the hole injection layers 6 of the plurality of light-emitting devices 10 may be shared.

In other embodiments, referring to FIG. 21B, the display substrate 100 includes an electron transport film layer 12 disposed on a side of both the pixel defining layer 8 and the first electrodes 1 of the plurality of light-emitting devices 10 away from the substrate 11, and portions of the electron transport film layer 12 located in the openings 81 are the electron transport layers 2 of the plurality of light-emitting devices 10. The electron transport layer 2 of the light-emitting device 10 includes a first portion G1 disposed on a side of the light-emitting layer and a second portion G2 disposed on a side wall of the opening 81. The electron transport layers 2 of the plurality of light-emitting devices 10 are in contact with each other.

For example, the electron transport film layer 12 further includes a portion located on a surface of the pixel defining layer 8, called an electron transport connection layer 2', through which the electron transport layers 2 of the plurality of light-emitting devices 10 are in contact with each other.

For example, the electron transport layers 2 of the plurality of light-emitting devices 10 are in contact with each other, that is, the sub-pixels of the plurality of light-emitting devices 10 share the electron transport film layer 12. During the manufacturing, the electron transport layer does not need to be patterned. Since the electron transport layer 2 has an extremely low lateral electric conductivity, it will not cause side leakage of the current.

In some examples, the hole transport layers 4 of the plurality of light-emitting devices 10 are not in contact with each other, and the hole injection layers 6 of the plurality of light-emitting devices 10 are not in contact with each other, so that both the hole transport layers 4 and the hole injection layers 6 of the plurality of light-emitting devices 10 are not shared.

As shown in FIGS. 21A and 21B, the first electrode 1 is a bottom electrode, and the second electrode 5 is a top electrode. The plurality of first electrodes are separated from each other without contact, and the plurality of second electrodes 5 are in contact with each other to be a whole as a second electrode layer. The second electrode layer provides the same signal for the plurality of light-emitting devices.

As shown in FIGS. 21C and 21D, in a case where the light-emitting devices included in the display substrate have upright structures, the structure of all film layers included in the light-emitting device has the following embodiments.

In some embodiments, referring to FIG. 21C, the display substrate 100 includes an electron transport film layer 12 disposed on a side of both the pixel defining layer 8 and the light-emitting layer 3 of the plurality of light-emitting devices 10 away from the substrate 11, and portions of the electron transport film layer 12 located in the plurality of openings 81 are the electron transport layers 2 of the plurality of light-emitting devices 10. The electron transport layer 2 of the light-emitting device 10 includes a first portion G1 disposed on the light-emitting layer 3 and a second portion G2 disposed on a side wall of the opening 81. The electron transport layers 2 of the plurality of light-emitting devices 10 are in contact with each other.

For example, the electron transport film layer 12 further includes a portion located on a surface of the pixel defining layer 8, called an electron transport connection layer 2', through which the electron transport layers 2 of the plurality of light-emitting devices 10 are in contact with each other.

For example, the electron transport layers 2 of the plurality of light-emitting devices 10 are in contact with each other, that is, the sub-pixels of the plurality of light-emitting devices 10 share the electron transport film layer 12. During the manufacturing, the electron transport layer does not need to be patterned. Since the electron transport layer 2 has an extremely low lateral electric conductivity, it will not cause side leakage of the current.

In some examples, the hole transport layers 4 of the plurality of light-emitting devices 10 are not in contact with each other, and the hole injection layers 6 of the plurality of light-emitting devices 10 are not in contact with each other, so that both the hole transport layers 4 and the hole injection layers 6 of the plurality of light-emitting devices 10 are not shared.

In some embodiments, as shown in FIG. 21D, the electron transport layers 2 of the light-emitting devices 10 are located in the plurality of openings 81, and the electron transport layers 2 of the plurality of light-emitting devices 10 are not in contact with each other.

For example, the electron transport layers 2 of the plurality of light-emitting devices 10 are not in contact with each other, that is, the electron transport layers 2 of the plurality of light-emitting devices 10 are not shared. In a manufacturing process, an initial electron transport layer provided as a whole layer is needed to be patterned by exposing and etching, so as to form a plurality of electron transport layers 2 respectively located in a plurality of openings, which may further reduce the crosstalk of electrical signals and improve device efficiency.

In some examples, the hole transport layers 4 of the plurality of light-emitting devices 10 are in contact with each other, and the hole injection layers 6 of the plurality of light-emitting devices 10 are in contact with each other, so that both the hole transport layers 4 and the hole injection layers 6 of the plurality of light-emitting devices 10 may be shared.

As shown in FIGS. 21C and 21D, the first electrode 1 is a top electrode, and the second electrode 5 is a bottom electrode. The plurality of second electrodes are separated from each other without contact, and the plurality of first electrodes 1 are in contact with each other to be a whole as a first electrode layer. The first electrode layer provides the same signal for the plurality of light-emitting devices.

The beneficial effects of the above display substrate 100 are the same as the beneficial effects of the display device 10 provided in the first aspect of the present disclosure, and will not be repeated here.

Figure 22:
FIG. 22 is a diagram showing a structure of a display apparatus, in accordance with some embodiments of the present disclosure.

Some embodiments of the present disclosure further provide a display apparatus 1000. As shown in FIG. 22, the display apparatus includes the display substrate as described above.

The display apparatus 1000 provided in the embodiments of the present disclosure may be any apparatus that displays images whether in motion (such as a video) or fixed (such as a still image), and regardless of text or image. More specifically, it is expected that the embodiments may be implemented in or associated with a plurality of electronic devices. The plurality of electronic devices may include (but are not limit to), for example, mobile phones, wireless devices, personal digital assistants (PDAs), hand-held or portable computers, global positioning system (GPS) receivers/navigators, cameras, MPEG-4 Part 14 (MP4) video players, video cameras, game consoles, watches, clocks, calculators, TV monitors, flat-panel displays, computer monitors, car displays (e.g., odometer displays), navigators, cockpit controllers and/or displays, camera view displays (e.g., display of rear view camera in vehicles), electronic photos, electronic billboards or signs, projectors, architectural structures, packaging and aesthetic structures (e.g., displays for displaying an image of a piece of jewelry), etc.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A light-emitting device, comprising:

a first electrode, an electron transport layer, a light-emitting layer, a hole transport layer and a second electrode that are arranged sequentially, wherein the electron transport layer includes at least one electron transport sub-layer; and in the at least one electron transport sub-layer, an electron transport sub-layer closest to the light-emitting layer is an electron transport sub-layer with a C-axis orientation; and the C-axis orientation is a direction perpendicular to a plane where the light-emitting layer is located; and in the electron transport sub-layer with the C-axis orientation, in the direction perpendicular to the plane where the light-emitting layer is located, a ratio of a number of crystal grains having no overlap with adjacent crystal grains to a total number of crystal grains is greater than 85%.

2. The light-emitting device according to claim 1, wherein in the electron transport sub-layer with the C-axis orientation, in a first direction, a ratio of a number of crystal grains, each crystal grain of which has a distance from an adjacent crystal grain smaller than a size of the crystal grain itself, to the total number of crystal grains is greater than 50%; and the first direction is parallel to the plane where the light-emitting layer is located.

3. The light-emitting device according to claim 1, wherein the electron transport layer is composed of one electron transport sub-layer; a single electron transport sub-layer is the electron transport sub-layer with the C-axis orientation, and a film thickness of the electron transport sub-layer with the C-axis orientation is in a range of 30 nm to 90 nm, inclusive.

4. The light-emitting device according to claim 1, wherein the electron transport layer is composed of two electron transport sub-layers; and in the two electron transport sub-layers, an electron transport sub-layer proximate to the light-emitting layer is the electron transport sub-layer with the C-axis orientation, and another electron transport sub-layer away from the light-emitting layer is an electron transport sub-layer with a non-C-axis orientation; and a film thickness of each electron transport sub-layer in the electron transport layer is in a range of 15 nm to 40 nm, inclusive.

5. The light-emitting device according to claim 1, wherein the electron transport layer includes at least three electron transport sub-layers;

in the at least three electron transport sub-layers, the electron transport sub-layer closest to the light-emitting layer is the electron transport sub-layer with the C-axis orientation;

an electron transport sub-layer closest to the first electrode is an electron transport sub-layer with the C-axis orientation or an electron transport sub-layer with a non-C-axis orientation; and an electron transport sub-layer disposed between the electron transport sub-layer closest to the light-emitting layer and the electron transport sub-layer closest to the first electrode is an electron transport sub-layer with the non-C-axis orientation.

6. The light-emitting device according to claim 5, wherein the electron transport layer is composed of three electron transport sub-layers; and a film thickness of each electron transport sub-layer in the electron transport layer is in a range of 10 nm to 30 nm, inclusive.

7. The light-emitting device according to claim 6, wherein a ratio of a thickness of an electron transport sub-layer in a middle of the three electron transport sub-layers to a total thickness of the electron transport layer is in a range of 0.23 to 0.35, inclusive.

8. The light-emitting device according to claim 7, wherein the electron transport sub-layer closest to the first electrode is the electron transport sub-layer with the C-axis orientation; and the electron transport sub-layer with the C-axis orientation closest to the light-emitting layer has a larger degree of C-axis orientation than the electron transport sub-layer with the C-axis orientation closest to the first electrode.

9. The light-emitting device according to claim 1, wherein same atoms included in a material of each electron transport sub-layer are oxygen atoms and zinc atoms.

10. The light-emitting device according to claim 9, wherein the electron transport layer includes at least two electron transport sub-layers; and the electron transport sub-layer closest to the light-emitting layer has a lower oxygen vacancy proportion than any remaining electron transport sub-layer.

11. The light-emitting device according to claim 10, wherein an oxygen vacancy proportion of the electron transport sub-layer closest to the light-emitting layer is lower by 5% to 25% than an oxygen vacancy proportion of any remaining electron transport sub-layer; or an oxygen vacancy proportion of the electron transport sub-layer closest to the light-emitting layer is lower by 5% to 25% than an oxygen vacancy proportion of any remaining electron transport sub-layer; and a LUMO energy level of the electron transport sub-layer closest to the light-emitting layer is closer to a LUMO energy level of the light-emitting layer than a LUMO energy level of any remaining electron transport sub-layer.

12. The light-emitting device according to claim 9, wherein the electron transport layer includes three electron transport sub-layers; an electron transport sub-layer in a middle further includes dopant atoms, and the dopant atoms include at least one of magnesium, gallium, and boron nitride.

13. The light-emitting device according to claim 12, wherein a conduction band energy level of the electron transport sub-layer containing the dopant atoms is shallower than a conduction band energy level of an electron transport sub-layer not containing dopant atoms.

14. The light-emitting device according to claim 1, wherein a material of the electron transport layer is at least one of inorganic materials, and each electron transport sub-layer in the electron transport layer is not provided with a ligand material; or a material of the electron transport layer is at least one of inorganic materials, and each electron transport sub-layer in the electron transport layer is not provided with a ligand material; and the light-emitting device further comprises:

an intermediate layer disposed between the light-emitting layer and the electron transport sub-layer closest to the light-emitting layer, wherein a material of the intermediate layer is an organic matter or a polymer, and the material of the intermediate layer fills pores between adjacent crystal grains of the electron transport sub-layer closest to the light-emitting layer.

15. The light-emitting device according to claim 1, wherein the light-emitting device has an inverted structure, and a face of each electron transport sub-layer in the electron transport layer away from the first electrode has a surface roughness in a range of 0.5 nm to 2 nm; or the light-emitting device has an upright structure, and a face of each electron transport sub-layer in the electron transport layer away from the second electrode has a surface roughness in a range of 0.5 nm to 2 nm.

16. A display substrate, comprising a plurality of light-emitting devices each according to claim 1.

17. A method for manufacturing a light-emitting device, the method comprising:

forming a first electrode;

forming an electron transport layer on the first electrode;

forming a light-emitting layer on the electron transport layer;

forming a hole transport layer on the light-emitting layer; and forming a second electrode on the hole transport layer, wherein the electron transport layer includes at least one electron transport sub-layer; in the at least one electron transport sub-layer, an electron transport sub-layer closest to the light-emitting layer is an electron transport sub-layer with a C-axis orientation; and in the electron transport sub-layer with the C-axis orientation, in a direction perpendicular to a plane where the light-emitting layer is located, a ratio of a number of crystal grains having no overlap with adjacent crystal grains to a total number of crystal grains is greater than 85%.

18. The method for manufacturing the light-emitting device according to claim 17, wherein forming the electron transport sub-layer closest to the light-emitting layer includes: forming the electron transport sub-layer with the C-axis orientation by using a magnetron sputtering process; or forming the electron transport sub-layer with the C-axis orientation, includes:

depositing a material of an electron transport sub-layer under a first temperature of a base by using the magnetron sputtering process, so as to form the electron transport sub-layer with the C-axis orientation, wherein the first temperature is a temperature of the base that enables the material to have the C-axis orientation, and is an ordinary temperature; or depositing the material of the electron transport sub-layer under a second temperature of the base by using the magnetron sputtering process, and annealing the material of the electron transport sub-layer at the second temperature, so as to form the electron transport sub-layer with the C-axis orientation, wherein the second temperature is a temperature of the base that enables the material to have the C-axis orientation, and is in a range of 200° C. to 500° C.; or depositing the material of the electron transport sub-layer under a second sputtering power by using the magnetron sputtering process, so as to form the electron transport sub-layer with the C-axis orientation, wherein the second sputtering power is a sputtering power that enables the material to have the C-axis orientation.

19. A method for manufacturing a light-emitting device, the method comprising:

forming a second electrode;

forming a hole transport layer on the second electrode;

forming a light-emitting layer on the hole transport layer;

forming an electron transport layer on the light-emitting layer; and forming a first electrode on the electron transport layer, wherein the electron transport layer includes at least one electron transport sub-layer; in the at least one electron transport sub-layer, an electron transport sub-layer closest to the light-emitting layer is an electron transport sub-layer with a C-axis orientation; and in the electron transport sub-layer with the C-axis orientation, in a direction perpendicular to a plane where the light-emitting layer is located, a ratio of a number of crystal grains having no overlap with adjacent crystal grains to a total number of crystal grains is greater than 85%.

20. The method for manufacturing the light-emitting device according to claim 19, wherein forming the electron transport sub-layer closest to the light-emitting layer includes: forming the electron transport sub-layer with the C-axis orientation by using a magnetron sputtering process; or forming the electron transport sub-layer with the C-axis orientation, includes:

depositing a material of an electron transport sub-layer under a first temperature of a base by using the magnetron sputtering process, so as to form the electron transport sub-layer with the C-axis orientation, wherein the first temperature is a temperature of the base that enables the material to have the C-axis orientation, and is an ordinary temperature; or depositing the material of the electron transport sub-layer under a second temperature of the base by using the magnetron sputtering process, and annealing the material of the electron transport sub-layer at the second temperature, so as to form the electron transport sub-layer with the C-axis orientation, wherein the second temperature is a temperature of the base that enables the material to have the C-axis orientation, and is in a range of 200° C. to 500° C.; or depositing the material of the electron transport sub-layer under a second sputtering power by using the magnetron sputtering process, so as to form the electron transport sub-layer with the C-axis orientation, wherein the second sputtering power is a sputtering power that enables the material to have the C-axis orientation.

* * * * *